United States Patent
Pope et al.

(10) Patent No.: US 10,348,974 B2
(45) Date of Patent: Jul. 9, 2019

(54) SOLID STATE LIGHTING FIXTURES AND IMAGE CAPTURE SYSTEMS

(71) Applicant: Cree, Inc., Durham, NC (US)

(72) Inventors: Daniel J. Pope, Morrisville, NC (US); Michael James Harris, Cary, NC (US); John Roberts, Durham, NC (US); Ashish Ekbote, Carpinteria, CA (US); Robert D. Underwood, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/665,573

(22) Filed: Aug. 1, 2017

(65) Prior Publication Data

US 2018/0041681 A1 Feb. 8, 2018

Related U.S. Application Data

(60) Provisional application No. 62/369,866, filed on Aug. 2, 2016.

(51) Int. Cl.
*F21K 9/00* (2016.01)
*H03K 7/08* (2006.01)
(Continued)

(52) U.S. Cl.
CPC ......... *H04N 5/2354* (2013.01); *F21V 23/003* (2013.01); *F21V 23/0464* (2013.01);
(Continued)

(58) Field of Classification Search
CPC .................................................... G03B 15/03
(Continued)

(56) References Cited

U.S. PATENT DOCUMENTS 6,528,954 B1 * 3/2003 Lys ............... A61N 5/0616
  315/158
6,948,829 B2 * 9/2005 Verdes ............... F21V 3/00
  315/71
(Continued)

FOREIGN PATENT DOCUMENTS

EP    2213932 A1    8/2010

OTHER PUBLICATIONS

Galperin, Yuri M., 'Introduciton to Modern Solid State Physics', Dept of Physics Oslo, Sep. 11, 2014, 477 pages.*
(Continued)

*Primary Examiner* — Clayton E. LaBalle
*Assistant Examiner* — Kevin C Butler
(74) *Attorney, Agent, or Firm* — Withrow & Terranova, P.L.L.C.

(57) ABSTRACT

An LED-based lighting fixture sets or adjusts a parameter of a drive signal that is used to drive its LEDs to be more compatible with the camera system; the camera system sets or adjusts an image capture parameter to be more compatible with the LED-based lighting fixture, or a combination thereof. The drive signal may be a PWM signal with a variable PWM frequency and/or duty cycle, a variable DC signal, or any combination thereof. The parameter of the drive signal that may be set or adjusted includes, but is not limited to, a PWM period, PWM frequency, PWM duty cycle, amplitude of the active and inactive portions of the PWM signal, and the like. The image capture parameter that may be adjusted includes, but is not limited to, frame rate, frame period, integration time, gain, shutter type (i.e. rolling shutter, global shutter, etc.), and the like.

10 Claims, 26 Drawing Sheets

(51) Int. Cl.
| | |
|---|---|
| *F21V 23/00* | (2015.01) |
| *F21V 23/04* | (2006.01) |
| *G03B 15/03* | (2006.01) |
| *G03B 17/00* | (2006.01) |
| *H03K 3/017* | (2006.01) |
| *H04N 5/235* | (2006.01) |
| *H05B 33/08* | (2006.01) |
| *H05B 37/02* | (2006.01) |
| *F21Y 115/10* | (2016.01) |

(52) U.S. Cl.
CPC ............ *G03B 15/03* (2013.01); *H03K 3/017* (2013.01); *H03K 7/08* (2013.01); *H04N 5/2351* (2013.01); *H04N 5/2352* (2013.01); *H04N 5/2357* (2013.01); *H05B 33/0815* (2013.01); *H05B 33/0827* (2013.01); *H05B 37/0272* (2013.01); *F21K 9/00* (2013.01); *F21Y 2115/10* (2016.08); *G03B 17/00* (2013.01); *G03B 2206/00* (2013.01); *G03B 2215/0567* (2013.01); *G03B 2215/0596* (2013.01)

(58) Field of Classification Search
USPC ......................................................... 396/199
See application file for complete search history.

(56) References Cited

U.S. PATENT DOCUMENTS

| | | | | |
|---|---|---|---|---|
| 7,187,136 B2* | 3/2007 | Fiorello | ............. | H05B 41/2882 315/224 |
| D594,576 S* | 6/2009 | Chan | ................. | D26/1 |
| 7,888,881 B2 | 2/2011 | Shteynberg et al. | | |
| 8,294,381 B2* | 10/2012 | Ge | ..................... | H05B 33/0815 315/246 |
| 8,466,628 B2* | 6/2013 | Shearer | ............. | H05B 33/0815 315/209 R |
| 8,829,800 B2 | 9/2014 | Harris | | |
| 8,898,444 B1* | 11/2014 | LeCrone | ............ | G06F 9/45558 710/1 |
| 9,273,860 B2* | 3/2016 | Pratt | ........................ | F21V 29/76 |
| 9,351,381 B2* | 5/2016 | Verfuerth | ........... | H05B 37/0272 |
| 9,456,482 B1* | 9/2016 | Pope | .................. | H05B 33/0854 |
| 9,686,477 B2* | 6/2017 | Walters | ................ | H04N 5/2354 |
| 9,699,856 B2* | 7/2017 | Roberts | ............. | H05B 33/0854 |
| 9,706,619 B2* | 7/2017 | Lim | ................... | H05B 33/0854 |
| 9,723,673 B2* | 8/2017 | Carrigan | ............ | H05B 37/0227 |
| 9,723,680 B2* | 8/2017 | Pope | ................. | H05B 33/0803 |
| 9,723,696 B2* | 8/2017 | Carrigan | ........... | H05B 37/0227 |
| 9,872,367 B2* | 1/2018 | Carrigan | ........... | H05B 33/0842 |
| 2006/0237636 A1* | 10/2006 | Lyons | ...................... | F21K 9/00 250/228 |
| 2007/0024213 A1* | 2/2007 | Shteynberg | ........ | H05B 33/0815 315/291 |
| 2007/0115228 A1* | 5/2007 | Roberts | ................ | G09G 3/3413 345/82 |
| 2007/0195270 A1* | 8/2007 | Hull | ...................... | B60Q 1/085 352/49 |
| 2007/0235639 A1* | 10/2007 | Rains, Jr. | .......... | H05B 33/0863 250/228 |
| 2008/0180381 A1* | 7/2008 | Jeong | ..................... | G09G 3/342 345/99 |
| 2008/0273754 A1* | 11/2008 | Hick | ................... | G06K 9/00771 382/103 |
| 2008/0278079 A1* | 11/2008 | Chen | ....................... | F21K 9/27 315/51 |
| 2009/0046457 A1* | 2/2009 | Everhart | ............. | F21V 23/009 362/235 |
| 2009/0086492 A1* | 4/2009 | Meyer | ................... | F21V 3/02 362/294 |
| 2009/0184917 A1* | 7/2009 | Park | ..................... | G09G 3/3426 345/102 |
| 2009/0273288 A1* | 11/2009 | Zhao | ...................... | G09G 3/342 315/185 R |
| 2009/0284169 A1* | 11/2009 | Valois | ................ | H05B 37/0254 315/291 |
| 2010/0007289 A1* | 1/2010 | Budike, Jr. | ............ | H05B 41/36 315/294 |
| 2010/0182294 A1* | 7/2010 | Roshan | ..................... | G01J 1/32 345/207 |
| 2010/0262296 A1* | 10/2010 | Davis | .................... | G05B 15/02 700/275 |
| 2010/0270935 A1* | 10/2010 | Otake | ................ | H05B 33/0803 315/185 R |
| 2010/0295946 A1* | 11/2010 | Reed | .................. | H05B 37/0227 348/164 |
| 2010/0301770 A1* | 12/2010 | Chemel | ............... | H05B 37/029 315/294 |
| 2011/0006604 A1* | 1/2011 | Chang | ............... | H02M 3/33561 307/31 |
| 2011/0095706 A1* | 4/2011 | Vilmi | ................. | H05B 33/0851 315/294 |
| 2011/0101868 A1* | 5/2011 | Weiss | ................. | H05B 37/0245 315/130 |
| 2011/0163680 A1* | 7/2011 | Welten | ............... | H05B 33/0818 315/186 |
| 2011/0204816 A1* | 8/2011 | Policy | ............... | H05B 37/0254 315/294 |
| 2011/0248640 A1* | 10/2011 | Welten | ............... | H05B 33/0815 315/210 |
| 2012/0043912 A1* | 2/2012 | Huynh | ............... | H05B 33/0827 315/297 |
| 2012/0091915 A1* | 4/2012 | Ilyes | .................. | H05B 37/0263 315/307 |
| 2012/0104974 A1* | 5/2012 | Saes | .................... | H05B 33/083 315/297 |
| 2012/0187845 A1* | 7/2012 | Saes | ................... | H05B 33/0818 315/113 |
| 2012/0223649 A1* | 9/2012 | Saes | ................... | H05B 33/0818 315/186 |
| 2012/0229041 A1* | 9/2012 | Saes | ..................... | H05B 33/083 315/200 R |
| 2013/0033872 A1* | 2/2013 | Randolph | ............. | F21V 29/004 362/294 |
| 2013/0044225 A1* | 2/2013 | Jeon | ...................... | H04N 5/2351 348/207.1 |
| 2013/0063042 A1* | 3/2013 | Bora | ................... | H05B 33/0863 315/292 |
| 2013/0200805 A1* | 8/2013 | Scapa | ..................... | F21V 23/0457 315/131 |
| 2013/0307419 A1* | 11/2013 | Simonian | ........... | H05B 33/0872 315/153 |
| 2014/0001952 A1* | 1/2014 | Harris | ................ | H05B 37/0272 315/51 |
| 2014/0001959 A1* | 1/2014 | Motley | ............... | H05B 37/02 315/149 |
| 2014/0001962 A1* | 1/2014 | Harris | ................ | H05B 33/0842 315/153 |
| 2014/0001963 A1* | 1/2014 | Chobot | .................. | H05B 37/02 315/153 |
| 2014/0070710 A1* | 3/2014 | Harris | ................. | H05B 33/0809 315/185 R |
| 2014/0072211 A1* | 3/2014 | Kovesi | ................... | G06T 7/2033 382/164 |
| 2014/0313711 A1* | 10/2014 | Hwu | ....................... | F21V 23/00 362/218 |
| 2015/0008829 A1* | 1/2015 | Lurie | ................. | H05B 37/0245 315/153 |
| 2015/0008831 A1* | 1/2015 | Carrigan | ............. | H05B 37/0227 315/153 |
| 2015/0009664 A1* | 1/2015 | Liang | ..................... | F21K 9/17 362/219 |
| 2015/0138784 A1* | 5/2015 | Pratt | ...................... | F21V 29/76 362/373 |
| 2015/0271886 A1* | 9/2015 | Upton | ................ | H05B 33/0845 315/209 R |
| 2015/0305119 A1* | 10/2015 | Hidaka | ................ | H05B 37/0218 315/153 |

(56) References Cited

U.S. PATENT DOCUMENTS

| | | | |
|---|---|---|---|
| 2016/0100086 A1* | 4/2016 | Chien | H04N 5/2256 |
| | | | 348/143 |
| 2017/0103710 A1* | 4/2017 | Zuo | G09G 3/3406 |
| 2017/0230364 A1* | 8/2017 | Barile | G06T 7/20 |
| 2018/0041681 A1* | 2/2018 | Pope | F21V 23/003 |

OTHER PUBLICATIONS

Safaa Alla Eldeen Hamza et al., 'The use of Pulse Width Modulation "PWM" Technique in LED Lighting Systems', International Journal of Science and Research, (www.ijsr.net), vol. 3 Issue 11, Nov. 2014, 5 pages.*

Wikipedia Organization, 'Chromaticity' Mar. 6, 2018, en.wikipedia.org/wiki/Chromaticity, 2 pages.*

CIE Commision Internationale De L'Eclairage, 'Technical Report' ISBN 3 901 906, 20.06.20014, 82 pages.*

International Search Report and Written Opinion for International Patent Application No. PCT/US2013/058256, dated Dec. 17, 2013, 9 pages.

International Preliminary Report on Patentability for International Patent Application No. PCT/US2013/058256, dated Mar. 19, 2015, 7 pages.

Notice of Allowance for U.S. Appl. No. 13/606,713, dated May 2, 2014, 7 pages.

\* cited by examiner

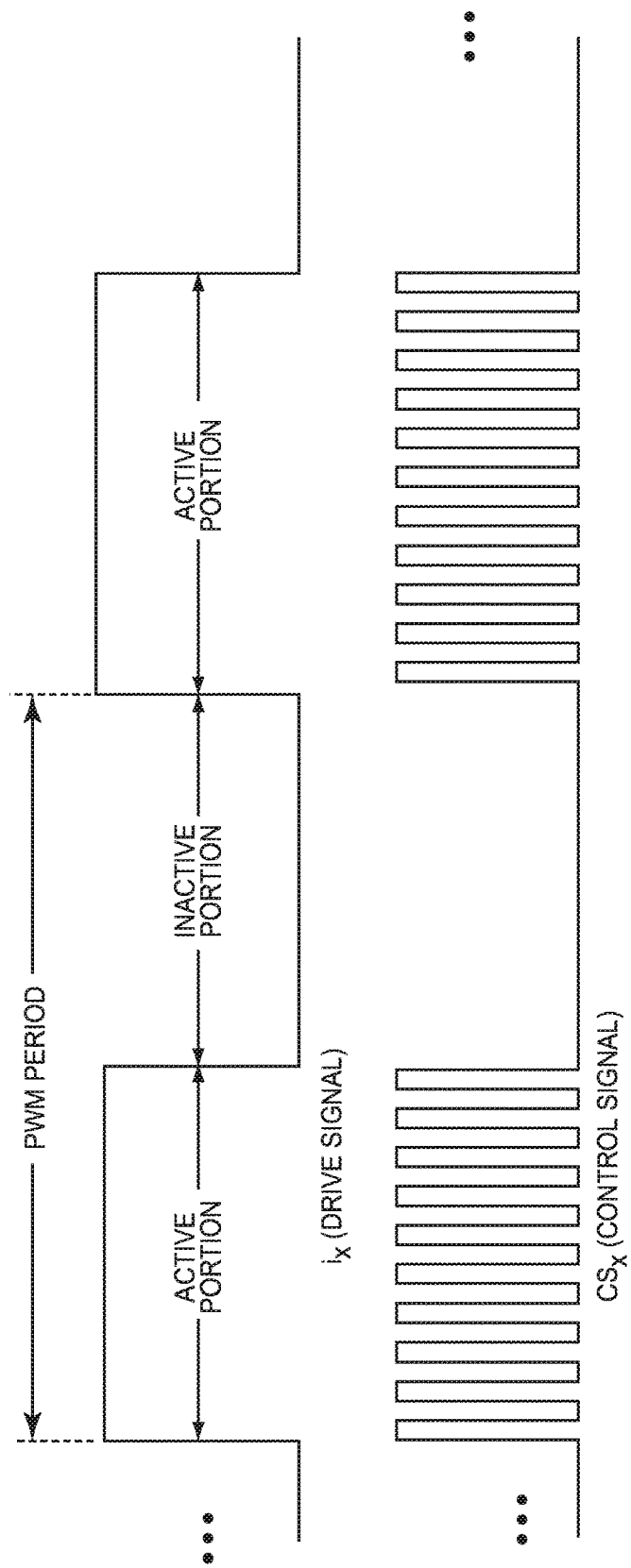

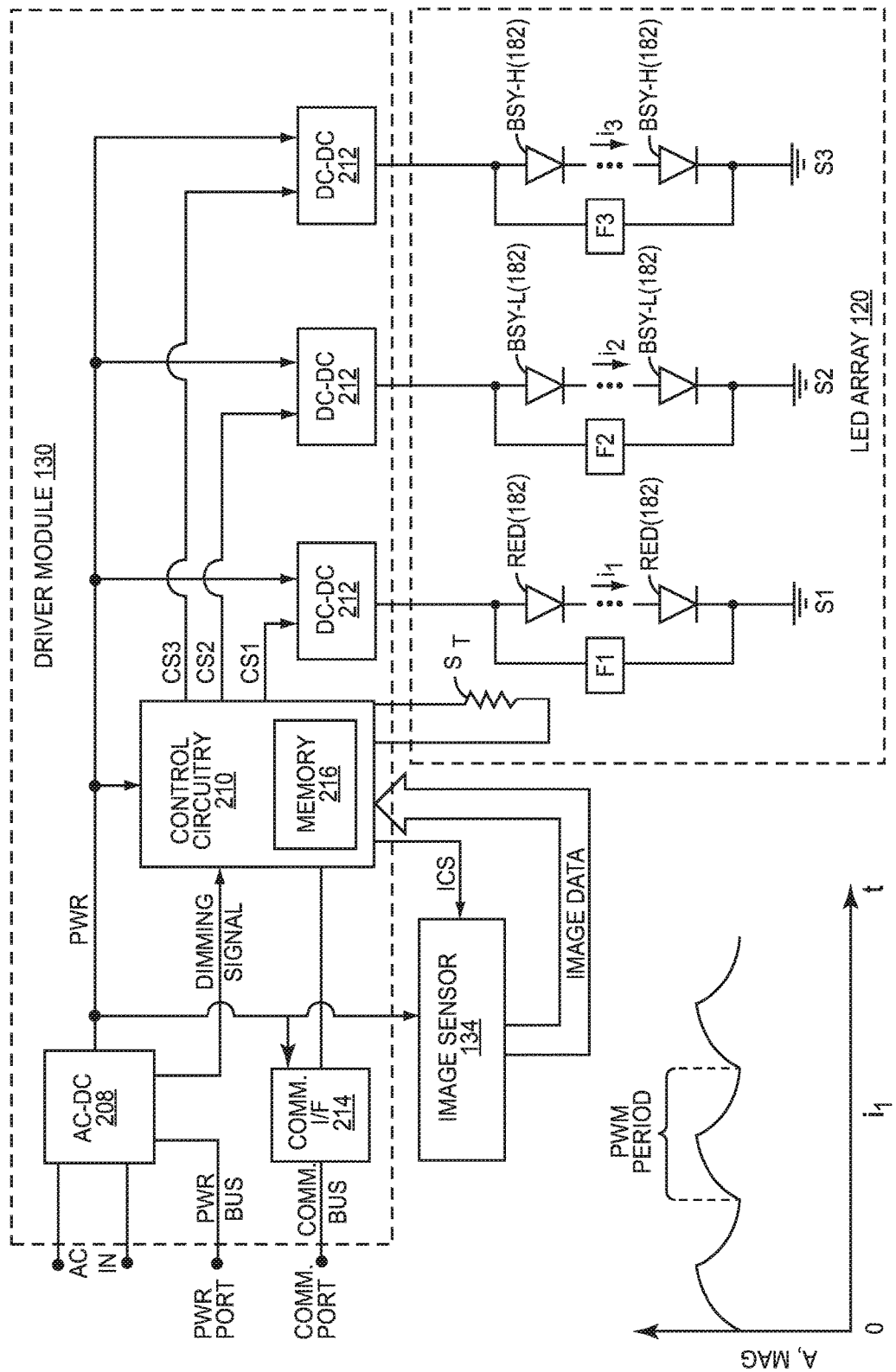

SOLID STATE LIGHTING FIXTURES AND IMAGE CAPTURE SYSTEMS

This application claims the benefit of U.S. Provisional Patent Application Ser. No. 62/369,866, filed Aug. 2, 2016, the disclosure of which is incorporated herein by reference in its entirety.

FIELD OF THE DISCLOSURE

The present disclosure relates solid state lighting fixtures and image capture systems.

BACKGROUND

In recent years, a movement has gained traction to replace incandescent light bulbs with lighting fixtures that employ more efficient lighting technologies as well as to replace relatively efficient fluorescent lighting fixtures with lighting technologies that produce a more pleasing, natural light. One such technology that shows tremendous promise employs light emitting diodes (LEDs). Compared with incandescent bulbs, LED-based light fixtures are much more efficient at converting electrical energy into light, are longer lasting, and are also capable of producing light that is very natural. Compared with fluorescent lighting, LED-based lighting fixtures are also very efficient, but are capable of producing light that is much more natural and more capable of accurately rendering colors. As a result, lighting fixtures that employ LED technologies are replacing incandescent and fluorescent bulbs in residential, commercial, and industrial applications.

Unlike incandescent bulbs that operate by subjecting a filament to a desired current, LED-based lighting fixtures require electronics to drive one or more LEDs. The electronics generally include a power supply and special control circuitry to provide uniquely configured drive signals that are required to drive the one or more LEDs in a desired fashion. Typically, the drive signal is a pulse width modulated (PWM) signal, which has a fixed period and a variable duty cycle. Varying the duty cycle varies of the light output of the LED-based lighting fixtures. The greater the duty cycle, the higher the light output, and vice versa.

During each period of the PWM signal, there is an active portion where current flows through the LEDs and an inactive portion where current does not flow through the LEDs. As a result, the LEDs rapidly turn on and off during each period of the PWM signal. The frequency of the PWM signal, which is equal to the inverse of the period of the PWM signal, is kept high enough so that rapidly turning the LEDs on and off is imperceptible to the human eye. Unfortunately, digital image capture systems, such as still and video cameras and the like are not as forgiving. Capturing images in an environment where LED-based lighting fixtures use PWM signals causes various undesirable artifacts, including banding. Banding is the phenomena where dark horizontal bands extend across the entire image and are distributed vertically throughout the entire image.

Banding is caused when portions of a video frame are being captured when the PWM signal is active and the LED-based lighting fixture is outputting light, and other portions of the video frame are being captured when the PWM signal is inactive and the LED-based lighting fixture is not outputting light. The dark bands correspond to the portions of the image that are captured when the PWM signal is inactive and the LED-based lighting fixture is not outputting light. The lighter bands that separate the dark bands correspond to the portions of the frame that are captured when the PWM drive signal is active and the LED-based lighting fixture is outputting light. The dark bands may be stationary or may move in a continuous fashion up or down within the captured video. The thickness, spacing, and darkness of the dark bands depend on the interaction between integration times and frame rates of the video camera and the frequency and duty cycle associated with the PWM signal used by the LED-based lighting fixtures.

Banding detracts from the user's visual experience and gives the perception that the associated equipment is of lesser quality or malfunctioning. Banding can also cause issues with various video processing, such as encoding and compression, which is required for virtually all video.

With a global shutter camera, the unwanted effects associated with the frame rate and/or integration time of the camera interacting or intermodulating with the PWM frequency of the light source can also manifest themselves as the screen decreasing then increasing in brightness along successive frames or having undesired levels of illumination in a still frame.

Other adverse effects are possible when image processing rates, such as the integration rate time and/or frame rate of the camera or image sensor negatively interact with frequency components of the LED light source, such as the PWM frequency, that results in periodic changes in light intensity or color.

Accordingly, there is a need for techniques to improve LED-based lighting fixtures, image capture systems, and a combination thereof to address the adverse intermodulation effects of the image processing rates of the camera or image sensor and the frequency components in the LED light sources, for example the banding or changes in brightness issues brought on by the LED-based lighting fixtures that employ PWM signals.

SUMMARY

An LED-based lighting fixture sets or adjusts a parameter of a drive signal that is used to drive its LEDs to be more compatible with the camera system; the camera system sets or adjusts an image capture parameter to be more compatible with the LED-based lighting fixture, or a combination thereof. The drive signal may be a PWM signal with a variable PWM frequency and/or duty cycle, a variable DC signal, or any combination thereof. The parameter of the drive signal that may be set or adjusted includes, but is not limited to, a PWM period, PWM frequency, PWM duty cycle, amplitude of the active and inactive portions of the PWM signal, and the like. The image capture parameter that may be adjusted includes, but is not limited to, frame rate, frame period, integration time, gain, shutter type (i.e. rolling shutter, global shutter, etc.), and the like.

To suppress or eliminate banding, the LED-based lighting fixture or an entity associated therewith may set or adjust the parameter(s) of the drive signal based on information stored in the LED-based lighting fixture or associated entity, information received directly or indirectly from the camera system, information received from a remote database over a local or wide area network, and the like. The parameter(s) of the drive signal may be adjusted with knowledge of the camera system's actual image capture parameters or without such knowledge wherein assumptions are statically or dynamically made as to common or likely image capture parameters.

For example, the LED-based lighting fixture may set or adjust one or more drive signal parameters based on default settings, actual image capture parameters received from the camera system, information pertaining to the type of camera system wherein the LED-based lighting fixture can derive or predict image capture parameters of the camera system, and the like. In the latter instance, the LED-based lighting fixture may access a database where the type of camera system is stored, the image capture parameters are stored for the camera system, and the like. Alternatively, the actual drive signal parameters or information from which the drive signal parameters are derived for the LED-based lighting fixture to use may be stored in the database for access by the LED-based lighting fixture.

To suppress or eliminate banding, the camera system or an entity associated therewith may set or adjust the image capture parameter(s) based on information stored in the camera system or associated entity, information received directly or indirectly from the LED-based lighting fixture or associated lighting system, information received from a remote database over a local or wide area network, and the like. The image capture parameter(s) may be set or adjusted with knowledge of the LED-based lighting fixtures drive signal parameters or without such knowledge wherein assumptions are statically or dynamically made as to common or likely drive signal parameters.

For example, the camera system may set or adjust one or more image capture parameters based on default settings, actual drive signal parameters received from the LED-based lighting fixture or associated lighting system, information pertaining to the type of LED-based lighting fixture wherein the camera system can derive or predict drive signal parameters of the LED-based lighting fixture, and the like. In the latter instance, the camera system may access a database where the type of LED-based lighting fixture is stored, the drive signal parameters are stored for the LED-based lighting fixture, and the like. Alternatively, the image capture parameters or information from which the image capture parameters are derived for the camera system to use may be stored in the database for access by the camera system. As noted above, the camera system may be integrated with or separate from the LED-based lighting fixture.

In one embodiment, a control system reduces the adverse effects of frequency component(s) in the light produced by LED lighting systems interacting with the image capture parameters of a camera or image sensor. Depending on the embodiment, the control system accomplishes this by determining, detecting and/or receiving image capture parameters of the camera or image sensor and/or drive signal parameters or other lighting characteristics of the LED light(s). Depending on the embodiment, in response to the image capture parameters from the camera or image sensor and/or drive signal parameters from the LED light(s), the control system adjusts the image capture parameters of the camera or image sensor and/or the drive signal parameters of the LED light(s) to reduce the adverse effects.

In certain of the embodiments, the control system or portions thereof can reside in the camera or image sensor, the LED light(s) or LED lighting system and/or outside of both. Depending on the embodiment, the frequency component information is provided from the camera or image sensor system to the LED-based lighting fixtures, from the LED-based lighting fixtures to the camera system, or a combination thereof. The information may be used for a variety of reasons, including supporting the suppression and elimination of the adverse intermodulation effects, such as banding. The control system can do this by adjusting various parameters of the camera(s) or image sensor(s) and/or of the LED light(s) In certain embodiments, the control system determines these parameters by processing information from the camera or image sensor of the light from the LED light(s) to determine drive signal parameters of the LED light(s).

The information pertaining to these parameters may be exchanged through wired or wireless means and in a direct or indirect fashion, wherein the information may pass through multiple devices before reaching a destination. Further, the information may be provided to a control entity, which processes the information and directly controls either the LED-based lighting fixtures, camera systems, or components thereof to facilitate the functionality described herein. Given the complexity and flexibility of these LED-based lighting fixtures, camera systems, and the control entities therefor, information delivery, information receipt, control processing, image and video processing, and the like may take place in various entities in a centralized or distributed fashion as those skilled in the art will appreciate upon reading the following disclosure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 22 is a timing diagram that shows the relationship of a PWM drive signal and a control signal according to one embodiment of the disclosure.

FIG. 23 is a schematic of a driver module with an image sensor and an LED array according to a second embodiment of the disclosure.

FIG. 24 illustrates a low-pass filtered PWM drive signal according to the embodiment of FIG. 23.

DETAILED DESCRIPTION

Figure 1A:
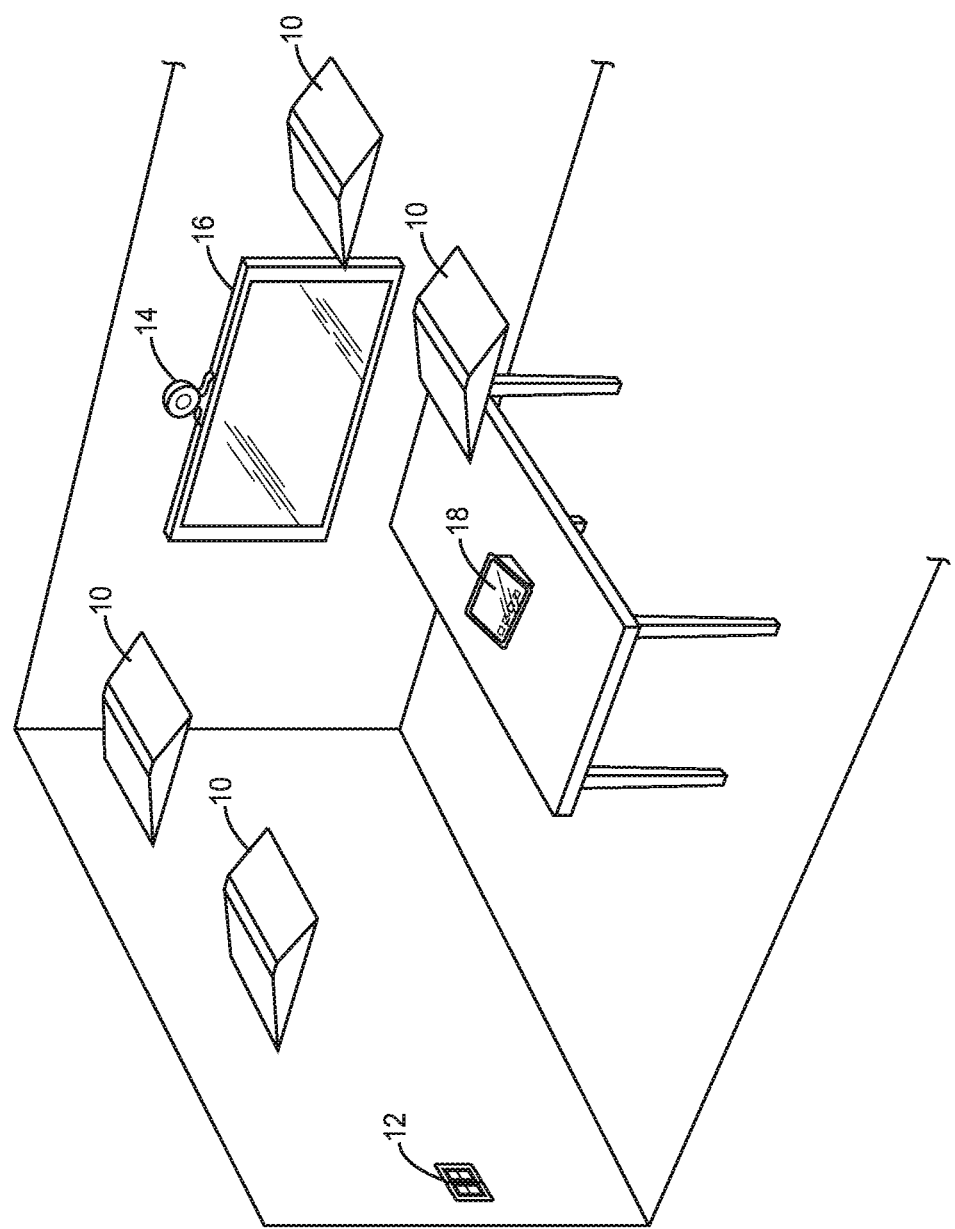
FIG. 1A illustrates a videoconferencing environment.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The following disclosure provides numerous techniques for suppressing, and in many cases eliminating, banding that occurs in video that was captured in the presence of an LED-based lighting environment. Two real-world embodiments are used to identify and describe these techniques. The first embodiment relates to a videoconferencing environment that is illuminated with LED-based lighting fixtures. The second embodiment relates to incorporating a camera system into an LED-based lighting fixture, and using that camera system to monitor ambient light, occupancy, and the like for the associated environment as well as capture still images and video for general monitoring or security purposes. While these two embodiments merely provide a vehicle for disclosing these banding suppression and elimination techniques, the techniques are applicable in any environment or system where banding occurs in video as a result of the video being captured in environment illuminated in whole or in part by LED-based lighting fixtures.

Regardless of embodiment, the LED-based lighting fixture sets or adjusts a parameter of a drive signal that is used to drive its LEDs to be more compatible with the camera system; the camera system sets or adjusts an image capture parameter to be more compatible with the LED-based lighting fixture, or a combination thereof. As described below, the drive signal may be a PWM signal with a variable PWM frequency and/or duty cycle, a variable DC signal, or any combination thereof. The parameter of the drive signal that may be set or adjusted includes, but is not limited to, a PWM period, PWM frequency, PWM duty cycle, amplitude of the active and inactive portions of the PWM signal, and the like. The image capture parameter that may be adjusted includes, but is not limited to, frame rate, frame period, integration time, gain, shutter type (i.e. rolling shutter, global shutter, etc.), and the like.

To suppress or eliminate banding, the LED-based lighting fixture or an entity associated therewith may set or adjust the parameter(s) of the drive signal based on information stored in the LED-based lighting fixture or associated entity, information received directly or indirectly from the camera system, information received from a remote database over a local or wide area network, and the like. The parameter(s) of the drive signal may be adjusted with knowledge of the camera system's actual image capture parameters or without such knowledge wherein assumptions are statically or dynamically made as to common or likely image capture parameters.

For example, the LED-based lighting fixture may set or adjust one or more drive signal parameters based on default settings, actual image capture parameters received from the camera system, information pertaining to the type of camera system wherein the LED-based lighting fixture can derive or predict image capture parameters of the camera system, and the like. In the latter instance, the LED-based lighting fixture may access a database where the type of camera system is stored, the image capture parameters are stored for the camera system, and the like. Alternatively, the actual drive signal parameters or information from which the drive signal parameters are derived for the LED-based lighting fixture to use may be stored in the database for access by the LED-based lighting fixture.

To suppress or eliminate banding, the camera system or an entity associated therewith may set or adjust the image capture parameter(s) based on information stored in the camera system or associated entity, information received directly or indirectly from the LED-based lighting fixture or associated lighting system, information received from a remote database over a local or wide area network, and the like. The image capture parameter(s) may be set or adjusted with knowledge of the LED-based lighting fixtures drive signal parameters or without such knowledge wherein assumptions are statically or dynamically made as to common or likely drive signal parameters.

For example, the camera system may set or adjust one or more image capture parameters based on default settings, actual drive signal parameters received from the LED-based lighting fixture or associated lighting system, information pertaining to the type of LED-based lighting fixture wherein the camera system can derive or predict drive signal parameters of the LED-based lighting fixture, and the like. In the latter instance, the camera system may access a database where the type of LED-based lighting fixture is stored, the drive signal parameters are stored for the LED-based lighting fixture, and the like. Alternatively, the image capture parameters or information from which the image capture parameters are derived for the camera system to use may be stored in the database for access by the camera system. As noted above, the camera system may be integrated with or separate from the LED-based lighting fixture.

In certain of the techniques, information is provided from the camera system to the LED-based lighting fixtures, from the LED-based lighting fixtures to the camera system, or a combination thereof. The information may be used for a variety of reasons, including supporting the suppression and elimination of banding. The information may be exchanged through wired or wireless means and in a direct or indirect fashion, wherein the information may pass through multiple devices before reaching a destination. Further, the information may be provided to a control entity, which processes the information and directly controls either the LED-based lighting fixtures, camera systems, or components thereof to facilitate the functionality described herein. Given the complexity and flexibility of these LED-based lighting fixtures, camera systems, and the control entities therefor, information delivery, information receipt, control processing, image and video processing, and the like may take place in various entities in a centralized or distributed fashion as those skilled in the art will appreciate upon reading the following disclosure.

The following disclosure initially describes a videoconferencing environment in general and then progresses into describing the various potential elements of a videoconferencing environment. Next, several anti-banding techniques are described in general and as they are applied in the videoconferencing environment. The suppression or elimination of banding and related video artifacts not only improves the visual experience, but also improves video encoding and compression algorithm and functions, which often struggle in the presence of banding. These struggles range from video degradation to significantly increased data rates.

Following the description of these anti-banding techniques, a detailed description of an exemplary LED-based lighting fixture, which includes a camera system, is provided. In certain embodiments, the LED-based lighting fixture or an associated device is able to communicate with the videoconferencing system, control itself based on information received from the videoconferencing system, provide information to the videoconferencing system, and the like to facilitate suppression or elimination of banding. Similarly, the videoconferencing system, the camera therein, or an associated device is able to communicate with the LED-based lighting fixture or associated device, control itself based on information received from the LED-based lighting fixture or associated device, provide information to the LED-based lighting fixture or associated device, and the like to facilitate suppression or elimination of banding.

An overview of a videoconferencing environment is described in association with FIG. 1A. As illustrated, the videoconferencing environment includes a lighting system and a videoconferencing system. The lighting system includes numerous LED-based lighting fixtures 10 and a wall controller 12, which is associated with and used to turn on, turn off, and control the dimming level for the LED-based lighting fixtures 10. For brevity, the LED-based lighting fixtures 10 will simply be referred to as lighting fixtures 10.

The videoconferencing system generally includes a video camera 14, a monitor 16, and a control module 18. The video camera 14 is used to capture video of the videoconferencing environment, and in particular, to capture video of the local participants (not shown) who are in the videoconferencing environment. The monitor 16 is used to display video of remote participants and content from a remote location to the local participants in the videoconferencing environment. The control module 18 provides a user interface that allows the local participants to control the videoconferencing session. The control module 18 may also include the requisite microphone, speaker, display, and input interface to facilitate the audio portion of the videoconferencing session. In this example, the control module 18 not only allows the local participants to control the videoconferencing session, but also provides the equivalent of a speakerphone. Those skilled in the art will recognize that more complex videoconferencing systems may include separate microphone and speaker systems; however, the illustrated audio conferencing system is sufficient to fully describe and enable the various concepts described herein.

Figure 1B:
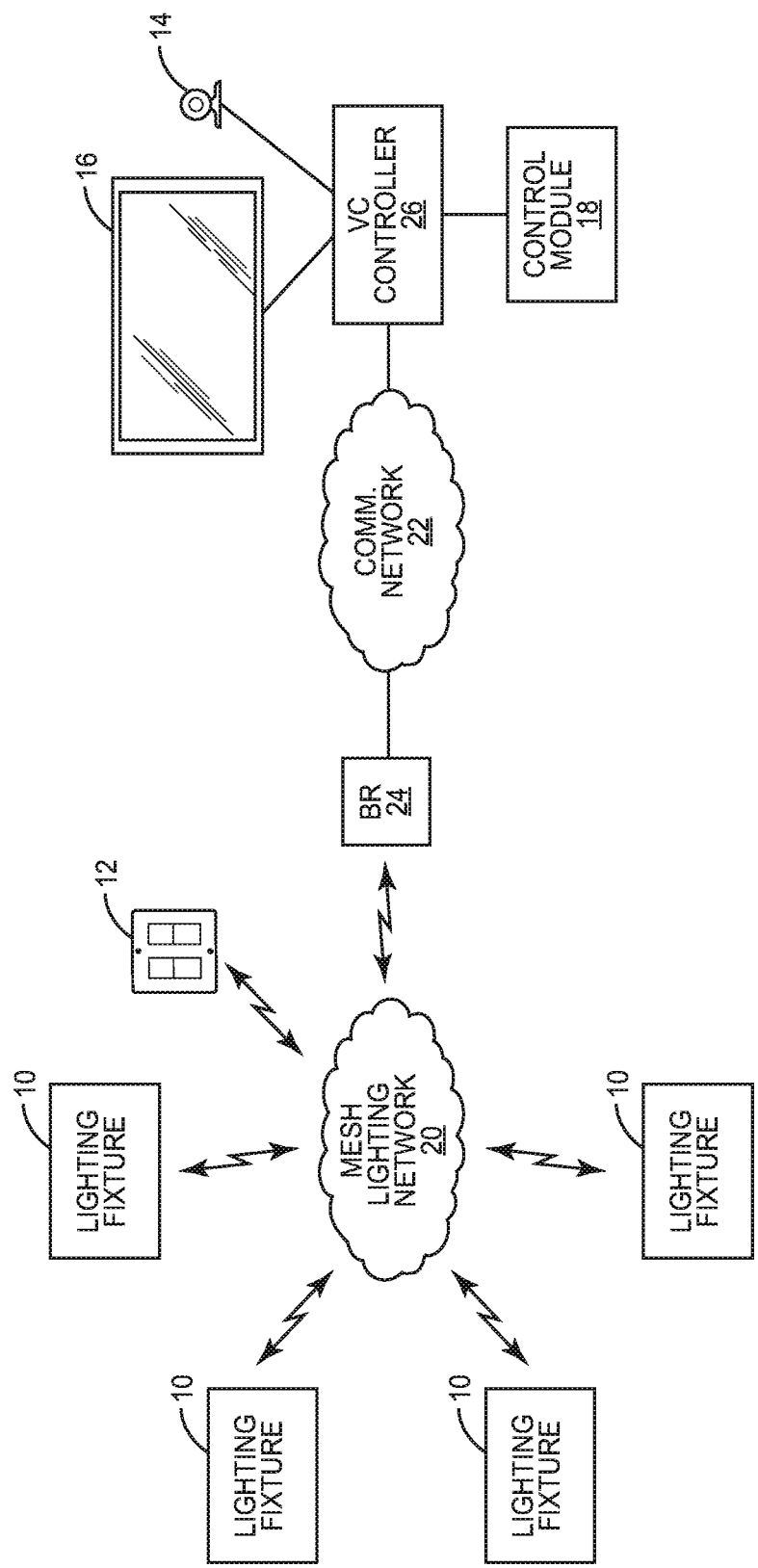
FIGS. 1B and 1C illustrate alternative block diagrams for the videoconferencing environment of FIG. 1A.
Figure 1C:
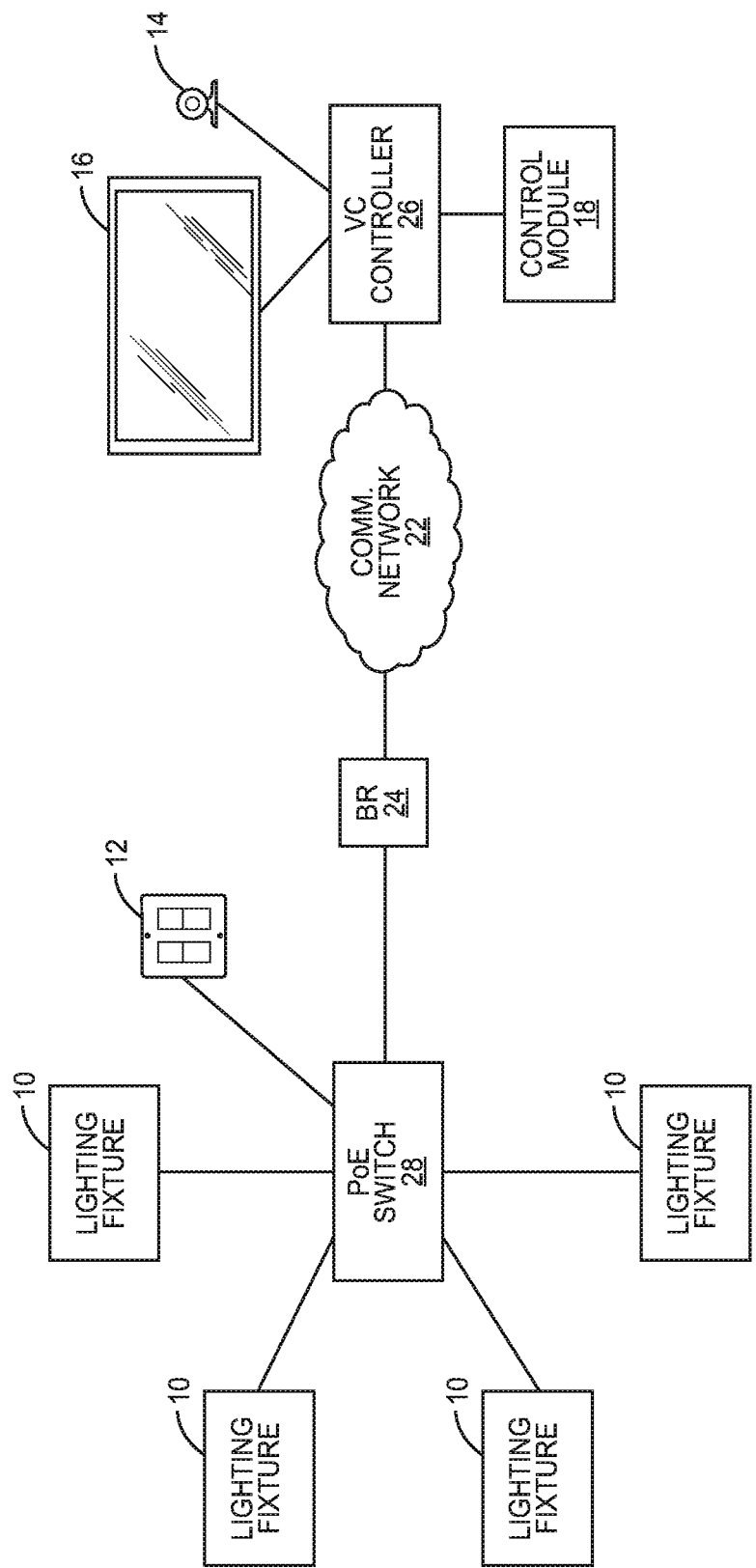

Turning now to FIGS. 1B and 1C, exemplary network architectures for the lighting system and videoconferencing system of FIG. 1A are illustrated. For the embodiment of FIG. 1B, the lighting fixtures 10 and the wall controller 12 form part of and are associated with a mesh lighting network 20. In one embodiment, the lighting network 20 is a mesh network, but those skilled in the art will recognize various available network configurations. As illustrated, the lighting fixtures 10, the wall controller 12, and a border router 24 also function as the routing nodes of the mesh lighting network 20. The lighting fixtures 10, the wall controller 12, and the border router 24 are connected to each other, and thus to the mesh lighting network 20, using wireless communications. For further information regarding mesh-networked lighting systems, please refer to U.S. Pat. No.

9,273,860 and U.S. patent application Ser. No. 15/192,308 filed Jun. 24, 2016, which are incorporated herein by reference.

The mesh lighting network 20 may communicate with the outside world as well as the videoconferencing system through a communication network 22, which may represent a local area network (LAN), a wide area network (WAN), the Internet, or any combination thereof. The mesh lighting network 20 and the communication network 22 are connected to each other through a border router (BR) 24, gateway, or the like in traditional fashion. Power to these devices may be provided in traditional fashion using a facility's AC (alternating current) infrastructure.

In FIG. 1C, the lighting fixtures 10, wall controller 12, and border router 24 may be coupled to each other through a more traditional LAN, wherein each device is wired through appropriate Ethernet cabling to an Ethernet switch, such as a power over Ethernet (PoE) switch 28. The PoE switch 28 may be connected to the communication network 22 through the border router 24. In such embodiments, the lighting fixtures 10, the wall controller 12, the border router 24, or any combination thereof may receive power from the PoE switch 28 through the Ethernet cabling using power over Ethernet (PoE) technology. Otherwise, power to some or all of these devices may be provided in traditional fashion using the facility's AC infrastructure.

For the videoconferencing system illustrated in FIGS. 1B and 1C, a video conference (VC) controller 26 may provide a central intelligence hub to which the video camera 14, monitor 16, and control module 18 are connected. In essence, the VC controller 26 will facilitate and control the videoconferencing session and the associated equipment based on information received remotely and from the control module 18. In particular, the VC controller 26 will receive video from the video camera 14 and pass the video to a remote location for display to the remote participants as well as pass the video to the local monitor 16, and to certain applications.

The VC controller 26 will also receive video from the remote location and send the video to the monitor 16 for display to the local participants. As indicated above, the video of the local participants, which is captured by the video camera 14, may be displayed in conjunction with the video of the remote participants on the monitor 16. The video of the local participants may be displayed in a relatively small window on the monitor 16 to allow the local participants to have visual feedback as to what is being displayed to the remote participants in traditional fashion.

Notably, providers of videoconferencing systems employ different levels of integration for the various components of the systems, and as such, the functionality of the VC controller 26, the video camera 14, the monitor 16, and the control module 18 may be integrated in one or any number of physical devices. For example, the functionality of the VC controller 26 and the control module 18 may be integrated into one conference module (not shown), wherein the video camera 14 is configured to mount onto a standard monitor 16, which is connected directly to the conference module. The type and level of integration will vary, but the overall functionality remains essentially the same. The concepts described further below apply to all types and levels of integration for videoconferencing systems.

Figure 2:
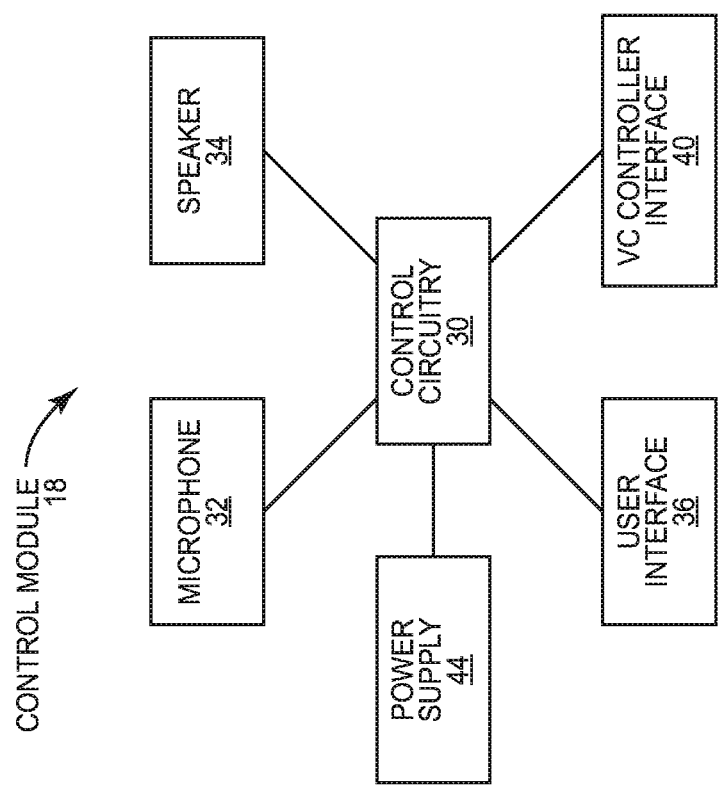
FIG. 2 illustrates a control module according to one embodiment of the disclosure.

FIG. 2 is a block diagram of an exemplary control module 18. The control module 18 includes control circuitry 30, a microphone 32, a speaker 34, a user interface 36, and a VC controller interface 40. As indicated above, the microphone 32 and speaker 34 support the audio for a videoconferencing session, and essentially provide the key components of a speakerphone. The user interface 36 may be used to control the speakerphone or other aspects of the videoconferencing session. The VC controller interface 40 may be a general or proprietary communication interface, which is coupled to the VC controller 26 directly or indirectly through a direct cable or network connection. Power for the control module 18 may be provided via a separate power supply 44 or via the VC controller interface 40.

Figure 3:
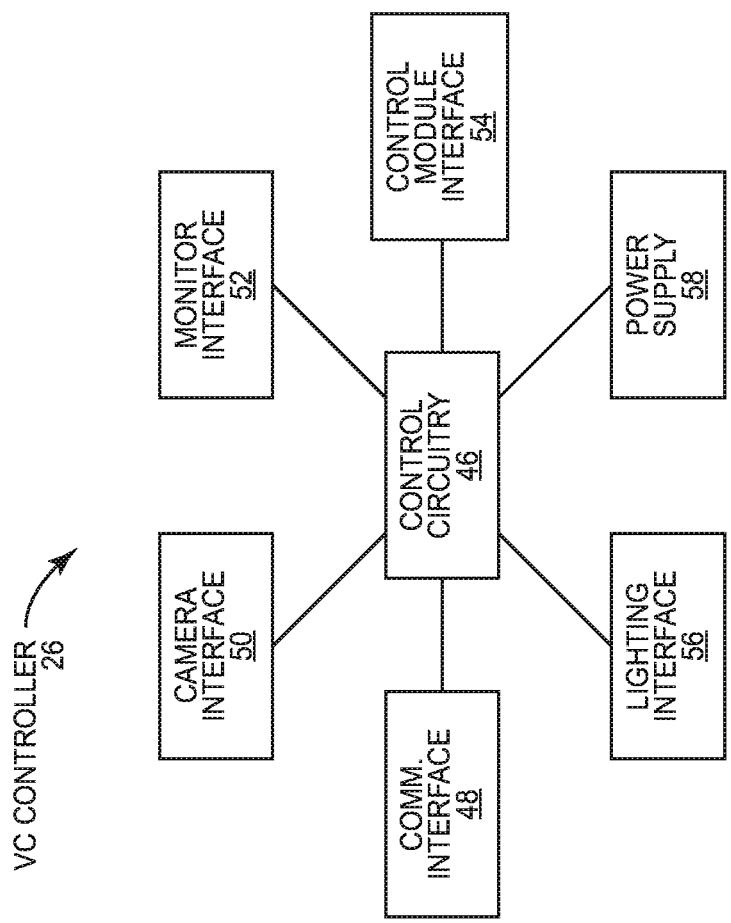
FIG. 3 illustrates a video conference controller according to one embodiment of the disclosure.

As illustrated in FIG. 3, the VC controller 26 functions as a central control module and has a variety of interfaces. These interfaces support incoming and outgoing video and communications with various networks and devices. In one embodiment, these interfaces include a communication interface 48, camera interface 50, monitor interface 52, and control module interface 54. The communication interface 48 is configured to facilitate communications with the communication network 22, which again may be a WAN or LAN. Through the communication interface 48, the videoconferencing system may exchange video, audio, and control information with remote videoconferencing systems to facilitate a videoconference.

The camera interface 50 is a video interface configured to receive video that is captured by the video camera 14, provide control information to the video camera 14, and receive information from the video camera 14. The information received from the video camera 14 may include image capture settings, diagnostics, and the like. The control information provided to the video camera 14 may provide general control, such as on and off commands, as well as image capture settings to use when capturing video. The image capture settings include, but are not limited to, integration times, frame rates, exposure settings, resolution settings, compression settings, and the like. The control circuitry 46 will control the image capture settings of the camera 14, receive video from the camera 14 via the camera interface 50, and facilitate delivery of the video that was received from the camera 14 to a remote video conferencing system via the communication interface 48. As noted above, the video captured from the camera 14 and received via the camera interface 50 may also be provided to the monitor 16 through the monitor interface 52. Video received from the remote videoconferencing system via the communication interface 48 is directed to the monitor 16 via the monitor interface 52 wherein the control circuitry 46 may process the video as necessary for proper display and integration with video from the camera 14 and presentation materials received from the local or remote participants.

The control module 18 is directly coupled to the VC controller 26 via the control module interface 54 or indirectly via the communication interface 48. The control circuitry 46 may facilitate the exchange of audio information between the control module 18 and the remote conference videoconferencing system to support bidirectional communications. Control information for the videoconferencing session or any of the devices associated therewith may be provided by the control module 18 via the control module interface 54 and/or the communication interface 48.

As described further below, the VC controller 26, or like functional component of the videoconferencing system, may also communicate directly or indirectly with the lighting fixtures 10, or a control system that is used to control the lighting fixtures 10. These communications may be provided through a dedicated lighting interface 56 or the more general communication interface 48. Through such an interface, the videoconferencing system may provide information to and/or control the lighting fixtures 10, and the lighting fixtures 10 may provide information to and/or control the videoconferencing system. Details are provided further below. Power for the VC controller 26 may be provided via a separate power supply 58 or via the communication interface 48 using PoE technology.

Figure 4:
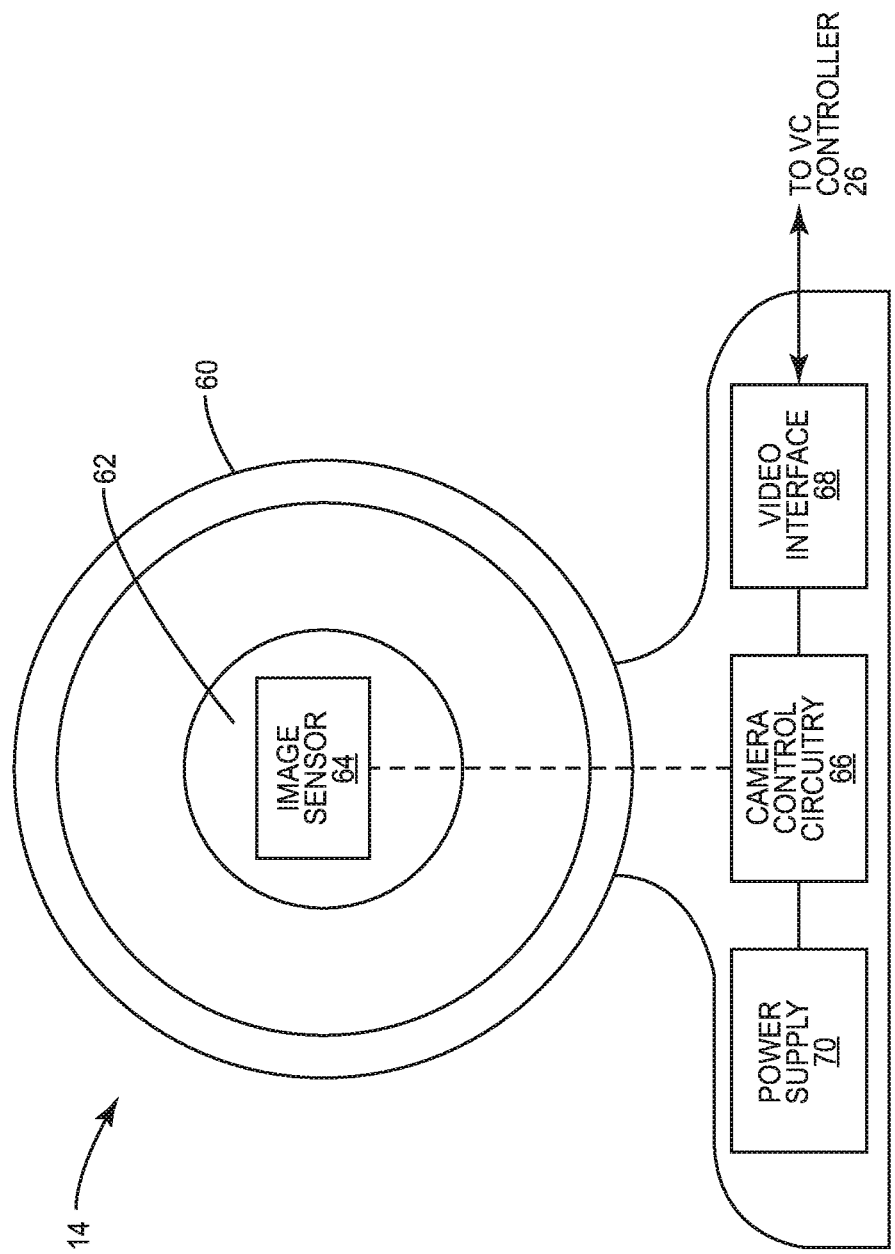
FIG. 4 illustrates a camera according to one embodiment of the disclosure.

Turning now to FIG. 4, an exemplary video camera 14 is illustrated. The video camera 14 includes a body 60 in which a clear lens 62 is mounted. An image sensor 64 resides behind the lens and is coupled to camera control circuitry 66, which is coupled to a video interface 68 and a power supply 70. At a high level, the image sensor 64 will capture and process video, and send the processed video to the camera control circuitry 66, which will provide any additional formatting, compression, and the like prior to delivering the video to the VC controller 26 or other device via the video interface 68.

The camera control circuitry 66 may control the image capture settings for the image sensor 64 based on information gathered from the image sensor 64, associated sensors (not shown), information received from the video interface 68 from a remote device, or any combination thereof. Again, power may be provided to the camera 14 via a separate power supply 70 or via the video interface 68. The video interface 68 may be a wired or wireless communication interface, which supports the transport of proprietary or standards-based video and associated control information. For example, the video interface 68 may take the form of an Ethernet-based LAN interface, a wireless LAN (WLAN) interface, a wired HDMI interface (high definition multimedia interface), or the like.

Figure 5:
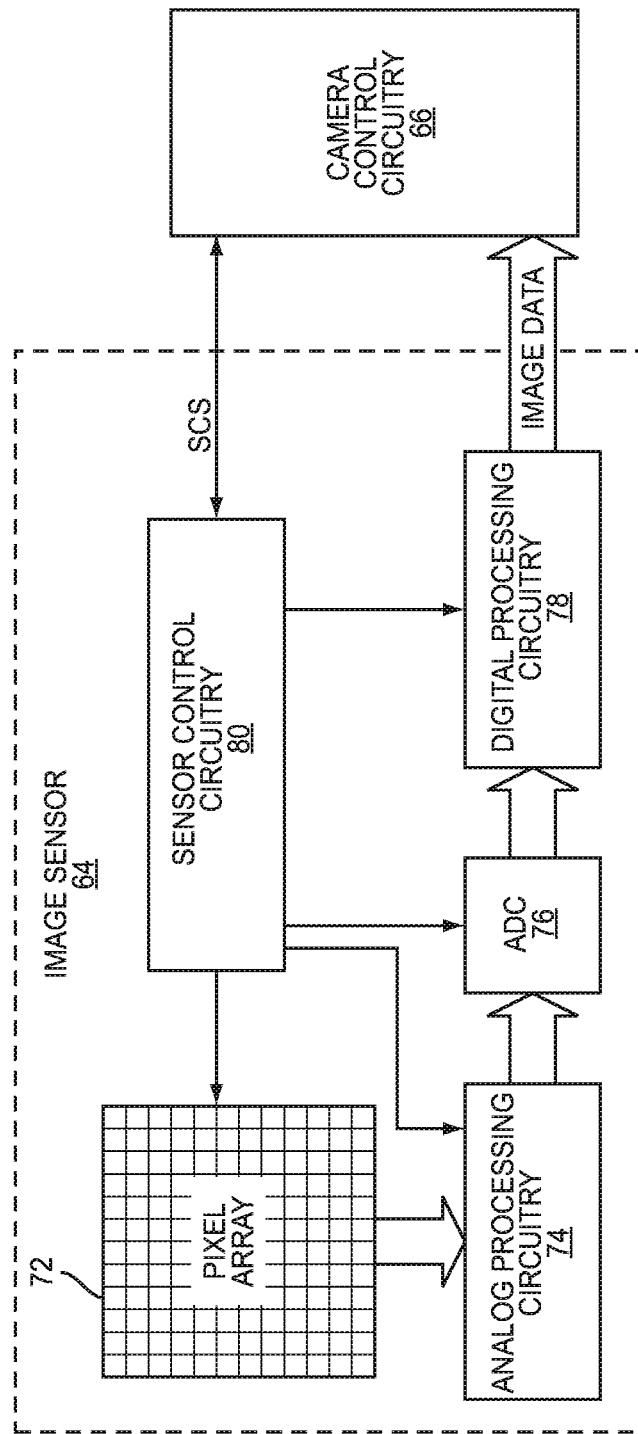
FIG. 5 illustrates an image sensor according to one embodiment of the disclosure.

An exemplary CMOS-based image sensor 64 is shown in FIG. 5. While a CMOS-based image sensor 64 is illustrated, those skilled in the art will appreciate that other types of image sensors 64, such as CCD-based sensors, may be employed. CMOS-based image sensors 64 are particularly useful in lighting applications because they have a broad spectral sensitivity that overlaps that of the human eye.

The image sensor 64 generally includes a pixel array 72, analog processing circuitry 74, an analog-to-digital converter (ADC) 76, digital processing circuitry 78, and sensor control circuitry 80. In operation, the pixel array 72 will receive an instruction to capture an image or video from the camera control circuitry 66. In response, the pixel array 72 will transform the light that is detected at each pixel into an analog signal and pass the analog signals for each pixel of the pixel array 72 to the analog processing circuitry 74 for a single image or each frame of video. For conciseness and readability, the following description will refer primarily to frames of video, but the same functionality applies to still images.

The analog processing circuitry 74 will filter and amplify the analog signals to create amplified analog signals, which are converted to digital signals by the ADC 76. The digital signals are processed by the digital processing circuitry 78 to create image data for each captured frame and generate a video signal from successively captured frames. The image data is passed to the camera control circuitry 66 for further processing and delivery via the video interface 68.

The image sensor 64 generally operates in either a global shutter mode or a rolling shutter mode. In global shutter mode, every pixel for a given frame is exposed over the same period of time. In essence, the exposed pixels of the pixel array 72 are allowed to build up a charge for a defined period of time, which is referred to as the integration time. Integration time is analogous to the exposure time in a film-based camera. When the integration time ends, the charge information for each pixel in the array of pixels is processed by the analog processing circuitry 74, the ADC 76, and the digital processing circuitry 78 as described above. The frame rate will correspond to the inverse of the sum of the integration time and at least a portion of the processing time. A disadvantage of using the global shutter mode is that frame rates may be limited due to the fact that the data for the entire array of pixels might need to be read out and at least partially processed before initiating capture of a subsequent frame.

When using a global shutter camera, when the environment in which images are captured is illuminated with lighting fixtures 10, which are driven with PWM signals, banding may occur and/or successive frames may appear lighter or darker than the previous frame.

Figure 6:
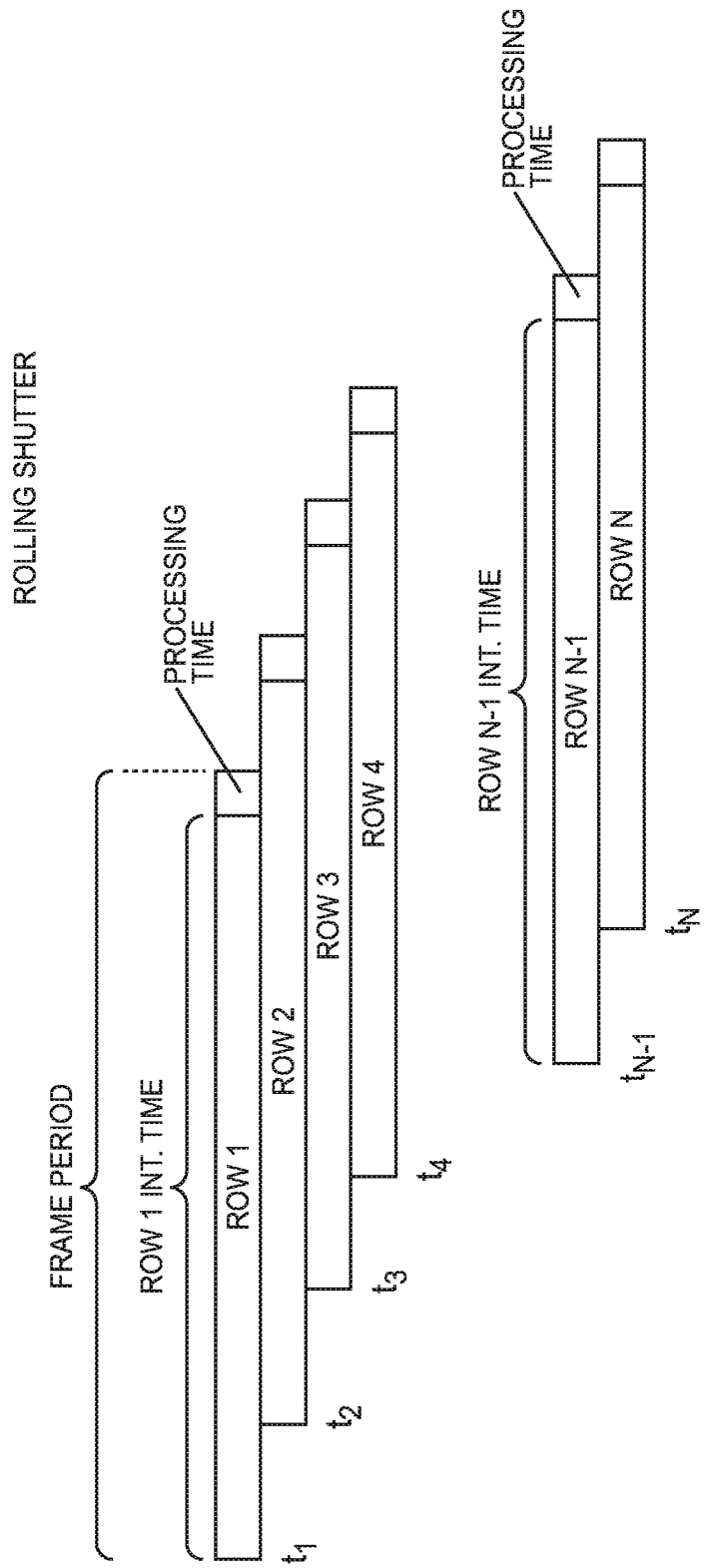
FIG. 6 illustrates integration times and frame rates for a rolling shutter camera.

In the rolling shutter mode, each row of pixels in the pixel array 72 is processed together. As illustrated in FIG. 6, the integration time for each subsequent row starts during and shortly after the beginning of the integration time for a preceding row. While the integration time is the same for each row; the integration time begins at a different point in time for each row. The initiation of an integration time for each subsequent row is delayed by a relatively small fraction of the overall integration time. Since the process repeats for each subsequent frame, this results in partially overlapping exposures for subsequent frames. As illustrated, the integration time for Row 1 starts at time T1, the integration time for Row 2 starts at time T2, and so on and so forth for each row of pixels in the pixel array 72. Note that time T2, when the integration time for Row 2 starts, occurs during and shortly after the integration time for Row 1. For a subsequent frame, the integration time for Row N−1 begins shortly after the beginning of the exposure time for the last row (Row N) of the pixel array 72 for the preceding frame. The frame period is determined by the sum of the integration time and the processing time, wherein the frame rate is the inverse of the frame period. The processing time generally corresponds to the amount of time that it takes to retrieve the image data from a row of pixels in the pixel array 72 and process the image data sufficiently to allow the process to repeat. As such, rolling shutter techniques can produce significantly higher frame rates than global shutter techniques. In certain embodiments, the integration time may equal the frame period. Notably, the time necessary to process each row of the pixel array 72 may span multiple frames. As such, a given video frame may be composed of rows taken at different integration times.

Returning to FIG. 5, the sensor control circuitry 80 will cause the pixel array 72 to begin capturing frames in response to receiving an instruction via a sensor control signal (SCS) from the camera control circuitry 66 or other control entity. The sensor control circuitry 80 controls the timing of the image processing provided by the analog processing circuitry 74, ADC 76, and digital processing circuitry 78. The sensor control circuitry 80 also sets the image sensor's processing parameters, such as the integration times, frame rates, gain, nature of filtering provided by the analog processing circuitry 74, as well as the type of image processing provided by the digital processing circuitry 78. These processing parameters may be dictated by information provided by the camera control circuitry 66.

Figure 7:
FIG. 7 illustrates banding in a video image.

Based on the above, the images for individual frames of video are not captured instantaneously. Instead, the images for the various frames are captured over time, and this time is the integration time. When the environment in which images are captured is illuminated with lighting fixtures 10, which are driven with PWM signals, banding may occur. FIG. 7 illustrates banding wherein an image that is displayed on the monitor 16 exhibits dark bands 82, which extend horizontally across the image and are vertically spaced apart from one another throughout the entire image. Alternatively, bands can extend vertically throughout the image.

As noted above, during each period of the PWM signal, there is an active portion where current flows through the LEDs and an inactive portion where current does not flow through the LEDs. As a result, the LEDs rapidly turn on and off during each period of the PWM signal. Banding is caused by portions of a video frame being captured when the PWM signal is active and the LED-based lighting fixture 10 is outputting light and other portions of the video frame being captured when the PWM signal is inactive and the LED-based lighting fixture is not outputting light. The darker bands 82 correspond to the portions of the image that are captured when the PWM signal is inactive and the LED-based lighting fixture 10 is not outputting light. The lighter bands 84 that are between the darker bands 82 correspond to the portions of the frame that are captured when the PWM drive signal is active and the lighting fixture 10 is outputting light. The darker bands 82 may be stationary or may move in a continuous fashion up or down within the captured video. The thickness, spacing, and relative darkness or lightness of the dark and light bands 82, 84 depend on the interaction between integration time and frame rate of the video camera 14 and the frequency and duty cycle associated of the PWM drive signal of the lighting fixtures 10.

Details of particular configurations for lighting fixtures 10 are provided further below. At this point, techniques for minimizing and even eliminating the banding illustrated above are described. Several of these techniques involve managing the relationship between the drive signal parameters of the lighting fixtures 10 and image capture parameters, such as the integration times, frame periods, or frame rates, of the camera 14. As noted above, the lighting fixture 10 and camera 14 may operate with or without direct knowledge of drive signal parameters, image capture parameters, or both. When operating without knowledge, the lighting fixtures 10 and/or the camera 14 operate using drive signal parameters and/or image capture parameters that are likely to suppress or eliminate banding based only on an expectation of how the other system is operating. When operating with knowledge, the lighting fixture 10 and the camera 14, or associated devices, communicate directly or indirectly with each other or other systems to share drive signal parameters and image capture parameters or information from which these parameters may be accessed or derived. While certain drive signal parameters and image capture parameters are used below for examples, other parameters may be set or adjusted alone or in combination to suppress or eliminate banding. While these techniques are described for the video camera 14, which is separate from the lighting fixtures 10, each of the techniques also applies to cameras or image sensors that are integrated with the lighting fixtures 10. Such embodiments are described further below after the banding reduction and elimination techniques are described.

Frame Period is Integer Multiple of PWM Period

Figure 8A:
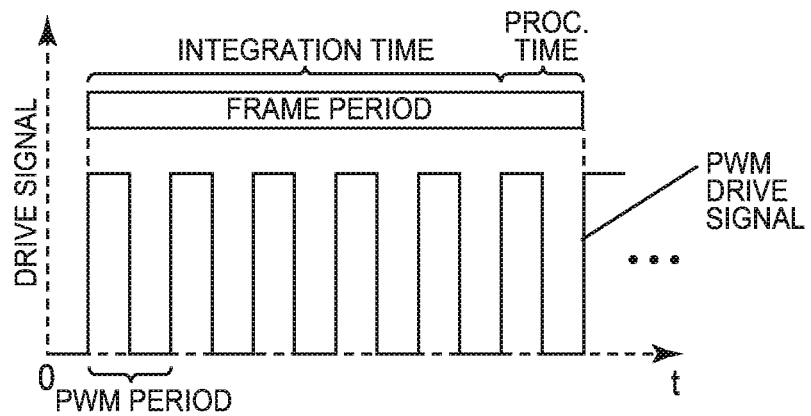
FIG. 8A illustrates a PWM drive signal and a frame period according to a first embodiment of the disclosure.

The first technique is described with reference to FIG. 8A. For this technique, the frame period for the camera 14 is an integer multiple of the PWM period of the PWM drive signal. In other words, the frequency of the PWM signal is an integer multiple of the frame rate. As illustrated, the integer multiple is six (6); however, the benefits of this technique increase as the integer multiple increases. Exemplary integer multiples are those with a value of or greater than 5, 10, 20, 25, 50, and 100. While frame rates may vary from camera to camera, standard frame rates for various regions in the world include: 24 frames per second (FPS), 23.976 FPS, 25 FPS, 29.97 FPS, 30 FPS, 50 FPS, 59.94 FPS, and 60 FPS. Higher frame rates, which are typically multiples of the above frame rates, may be used for high-speed video cameras.

As an example, assume that the camera 14 captures video at 60 FPS. If the camera 14 operates at 60 FPS, the frequency of the PWM signal is set to an integer multiple of 60. The higher the integer multiple, the greater the reduction in amplitude (darkness) of the horizontal bands 82. Further, as the integer multiple increases, the horizontal bands 82 become thinner and more numerous. The combination of reducing the amplitude and thickness of the horizontal bands 82 as well as increasing the number of the horizontal bands 82 significantly improves the viewing experience for the user. An added benefit is that the lighting fixture 10 produces light with less flicker, which enhances the visual quality of the general illumination provided by the lighting fixture 10.

If the effective frequency for the PWM signal is 3000 Hz, the PWM period for the PWM signal 0.33 ms. For a camera 14 running at 60 FPS, the frame period is 16.67 ms. Subtracting 0.17 ms for processing time from the frame period leads to an integration time of about 16.5 ms, which is about 50 times the PWM period (0.33 ms) of the PWM signal. With an integration-time-to-PWM-period ratio of 50, the amplitude of the horizontal bands 82 will only be about 2% of the worst case amplitude. At this level, banding is significantly reduced, if not minimized, enough to assure acceptable video quality and reduce any secondary impact on downstream encoding performance.

If the effective frequency for the PWM signal is 600 Hz, the PWM period for the PWM signal 1.67 ms. For a camera 14 running at 60 FPS, the frame period is 16.67 ms. Subtracting 0.17 ms for processing time from the frame period leads to an integration time of about 16.5 ms, which is about ten (10) times the PWM period (1.67 ms) of the PWM signal. With an integration-time-to-PWM-period ratio of 10, the amplitude of the horizontal bands 82 will only be about 10% of the worst case amplitude. At this level, the banding is visible and may crawl, but the banding is significantly reduced and has less impact on downstream video encoder performance.

For standard camera frame rates of 15 FPS, 20 FPS, 24 FPS, 30 FPS, and 60 FPS, a PWM period (or PWM frequency) of 8.333 ms (240 Hz), 2.083 ms (480 Hz), 1.667 ms (600 Hz), or 1.389 ms (720 Hz) would reduce, if not eliminate, banding when associated cameras 14 use these frame rates. Operating at these PWM periods, or integer fractions thereof, will also minimize the perceptibility of flicker.

In certain embodiments, the camera 14 or an associated device, such as the VC controller 26, are configured to actually detect the PWM period or frequency that is used by the lighting fixtures 10. In particular, the camera 14 will capture video and analyze the captured video to detect the PWM period or frequency being used by the lighting fixtures 10. The PWM frequency and/or period can be determined by use of algorithmic analysis. For example, a Goertzel algorithm or a Fast Fourier Transform (FFT) algorithm can be used. From the captured video, the camera 14 or the associated device are able to identify active and inactive portions of the PWM drive signal based on identifying the periodic increases and decreases in overall light that are caused by the PWM drive signal periodically switching between the active and inactive portions. From this information, the camera 14 or the other associated device can detect the beginning of successive PWM periods and calculate the PWM period based thereon. Once the PWM period has been detected, the camera 14 can set its frame rate to be an integer multiple of the detected PWM period.

Global Shutter Camera Solution

With a global shutter camera, the unwanted effects associated with the frame and/or integration frequency or rate interacting with the PWM frequency or other periodic variation of the light source can manifest themselves as the screen periodically decreasing then increasing in brightness. Once the PWM has been detected, determined and/or received, the global shutter camera can identify the PWM waveform (the successive PWM periods). The global shutter camera can synchronize its integration period to the start of each PWM period to match the PWM waveform. This synchronization can be accomplished multiple ways as would be understood by one of skill in the art, including, but not limited to, a phase lock loop (PLL) control system. If the PWM frequency and the integration time remain synchronized and do not materially change for consecutive frames, the adverse effects, such as unwanted change in brightness for successive frames or banding, can be reduced or eliminated, if the integration time is synchronized to match the PWM waveform. Note that in an environment with multiple light fixtures, this solution will be optimized if the PWM is synchronized across all of the fixtures with the integration rate and/or frame rate of the camera(s) or image sensor(s).

Notably, if the lighting system and the video conferencing system are able to communicate with one another, the lighting fixture 10 or other associated device in the lighting system can send information bearing on the PWM period or frequency to the videoconferencing system. The videoconferencing system will respond by having the camera 14 set its frame rate to be a multiple of the PWM period. In one embodiment, the lighting fixture 10 is configured to share information bearing on the PWM period or frequency to the VC controller 26, which will pass the information to the camera 14, or this information may be sent directly to the camera 14.

Alternatively, the videoconferencing system may be configured to share its current frame rate or a set of possible frame rates with the lighting system, and perhaps directly or indirectly to the lighting fixture 10. Upon receipt of the frame rate information, the lighting fixture 10 will select a PWM period such that the frame rate is an integer multiple of the PWM period.

Integration Time is Integer Multiple of PWM Period

The second technique is described with reference to FIG. 8B. For this technique, the actual integration time (as opposed to the frame period) for the image sensor 64 of the camera 14 is an integer multiple of the PWM period of the PWM drive signal of the lighting fixture 10. As illustrated, the integer multiple is six (6). Exemplary integer multiples are those with a value of or greater than 1, 5, 10, 20, 25, 50, and 100. When the integration time is an integer multiple of the PWM period of the PWM drive signal, the banding can be totally eliminated. In general, the higher the integer multiple, the better the results.

In embodiments where the camera 14 or an associated device are configured to actually detect the PWM period or frequency that is used by the lighting fixtures 10, the camera 14 or the associated device are able to identify active and inactive portions of the PWM drive signal based on identifying the periodic increases and decreases in overall light that are caused by the PWM drive signal periodically switching between the active and inactive portions. From this information, the camera 14 or the other associated device can detect the beginning of successive PWM periods and calculate the PWM period based thereon. Once the PWM period has been detected, the camera 14 can set its integration time to be an integer multiple of the detected, PWM period.

If the lighting system and the video conferencing system are able to communicate with one another, the lighting fixture 10 or other associated device in the lighting system can send information bearing on the PWM period or frequency to the videoconferencing system. The videoconferencing system will respond by having the camera 14 set its integration time to be a multiple of the PWM. In one embodiment, the lighting fixture 10 is configured to share information bearing on the PWM period or frequency to the VC controller 26, which will pass the information to the camera 14, or this information may be sent directly to the camera 14.

Alternatively, the videoconferencing system may be configured to send its current integration time or a set of possible integration times to the lighting system, and perhaps directly or indirectly, to the lighting fixture 10. Upon receipt of the integration time information, the lighting fixture 10 will select a PWM period such that the integration time is an integer multiple of the PWM period.

If the PWM period of the PWM drive signal is known to the camera 14, the camera 14 can dynamically adjust the integration time of the image sensor 64 based on the PWM period of the PWM drive signal when image capture conditions change. For example, if the camera 14 determines that the current integration time needs to be increased for proper exposure, the camera 14 can switch from the current integration time, which is an integer multiple of the PWM period of the PWM drive signal, to a new integration time, which is larger than the prior integration time and also an integer multiple of the PWM period of the PWM drive signal, and vice versa. As such, the integration time can change as needed, but will be dynamically adjusted in steps that are integer multiples of the PWM period of the PWM drive signal. This concept can also be applied for frame rates, wherein the frame rate is adjusted such that the frame period is dynamically adjusted in steps that are integer multiples of the PWM period of the PWM drive signal. In these examples, the camera 14 will track the PWM period of the PWM drive signal.

Similarly, if the integration time of the image sensor 64 for the camera 14 is known to the lighting fixture 10 or an entity controlling the lighting fixture 10, the lighting fixture 10 may adjust its PWM drive signal such that the PWM period is an integer fraction of the integration time. As such, the lighting fixture 10 will essentially track the integration time of the image sensor 64 to ensure that the integration time is an integer multiple of the PWM period of the PWM drive signal. Alternately, the lighting fixture 10 may track the frame rate of the image sensor 64 to ensure that the frame rate is an integer multiple of the PWM period of the PWM drive signal.

Elevated Base Level for Inactive Portion of Drive Signal

A third technique is described with reference to FIG. 8C. For a typical PWM drive signal, there is an active portion and an inactive portion during each PWM period. The magnitude associated with the active portion is generally the same for each PWM period. The magnitude associated with the inactive portion is generally zero. As such, the PWM drive signal appears as a series of pulses that transition between a fixed magnitude and zero. As the duty cycle is varied, the width of the pulses will vary accordingly.

For the third technique, the magnitude of inactive portion of the PWM drive signal is not dropped to zero, but instead merely drops to a lower level, which is referred to as a base level. The base level may vary from application to application, but is intended to keep a defined minimum amount of current flowing through the LEDs of the lighting fixture 10 at all times. By preventing the current from going to zero during the inactive portion of the PWM drive signal, the LEDs are always emitting a certain amount of light. Thus, the horizontal bands 82 are significantly lightened, which minimizes the impact of the horizontal bands 82 on the viewing experience. The higher the base level during the inactive portion of the PWM drive signal, the lighter the horizontal bands 82. However, increasing the base level will increase the lowest possible dimming setting for the lighting fixture 10 and limit the range of correlated color temperature (CCT) adjustment, as will be explained in further detail below.

Figure 8B:
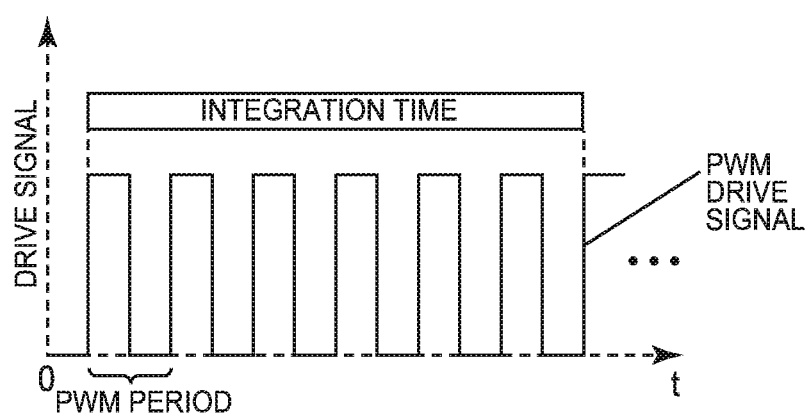
FIG. 8B illustrates a PWM drive signal and an integration time according to a second embodiment of the disclosure.
Figure 8C:
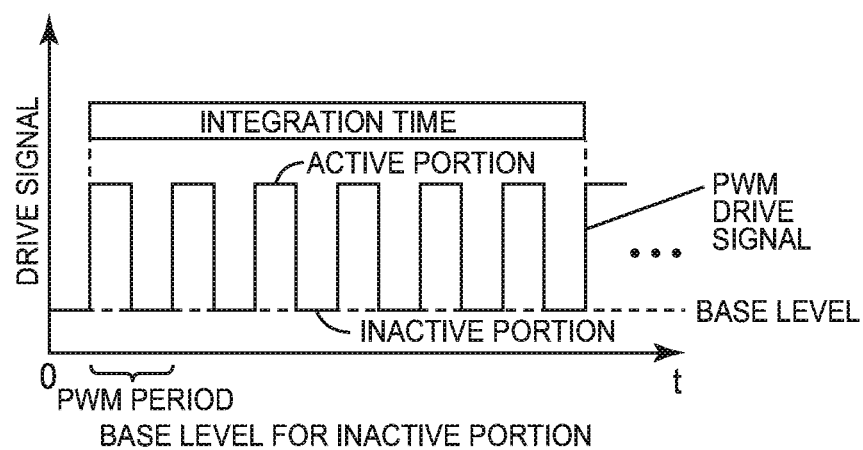
FIG. 8C illustrates a PWM drive signal with a minimum base level for the inactive portion of the PWM period and an integration time according to a third embodiment of the disclosure.
Figure 8D:
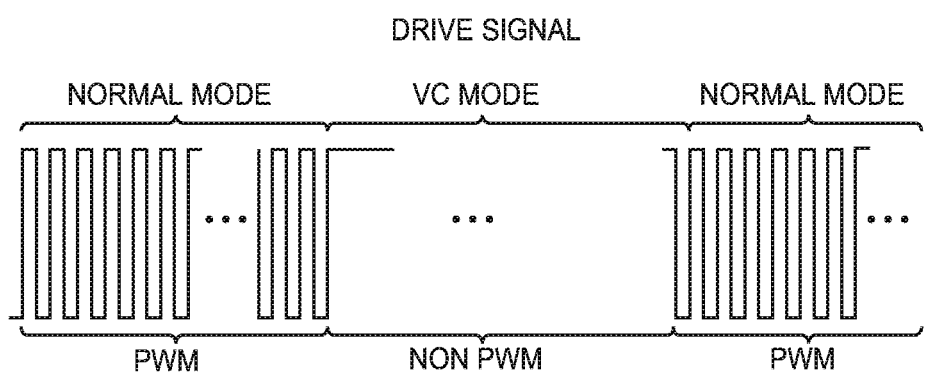
FIG. 8D illustrates a PWM drive signal according to a fourth embodiment of the disclosure.

A fourth technique is described in association with FIG. 8D. For this technique, the PWM drive signal, which is provided to the LEDs of the lighting fixture 10, transitions from a PWM signal to a non-PWM, DC (direct current) signal during a videoconference (VC) mode. As such, the lighting fixture 10 will drive the LEDs with a PWM signal during a normal mode and drive the LEDs with a non-PWM signal during VC mode. Dimming during the normal mode is facilitated by varying the duty cycle of the PWM signal. Dimming during the non-PWM mode is facilitated by varying the magnitude of the DC signal. The lighting fixture 10 may receive an instruction indicative of the videoconferencing system being activated, and upon receipt of this instruction, transition from the normal mode to the VC mode. In addition to transitioning to VC mode, the DC signal provided to the LEDs of the lighting fixture 10 may be set to a desired DC level that corresponds to a desired lighting level, which is often elevated, if not maximized for videoconference session. The lighting fixture 10 may enter VC mode directly or by adjusting various settings to force the lighting fixture 10 to operate at a 100% duty cycle, or with a non-PWM signal. Details on how the lighting fixture 10 provides drive signals of this nature is described further below.

A fifth technique effectively changes the drive signals that are provided to the LEDs of the lighting fixture 10 to variable, DC signals, which are not pulsed width modulated. In essence, the lighting fixture 10 will operate continuously in the same manner as described for the VC mode of the previous technique. This technique has proven to be particularly beneficial when used with certain types of LEDs, as is described further below in association with FIG. 25.

A sixth technique relies on the PWM drive signals of the various lighting fixtures 10 in the videoconferencing environment to be intentionally out of phase with one another, such that the PWM drive signals of the various lighting fixtures 10 are not synchronized. Assuming the lighting fixtures 10 have the ability to synchronize their system clocks or generate a clock signal from a signal that is accessible to the lighting fixtures 10, such as the AC supply signal, network heartbeat, or the like, the lighting fixtures 10 will randomly select a phase offset relative to a common clock signal. By keeping the PWM drive signals of the lighting fixtures 10 out of phase, at least one lighting fixture 10 will likely be operating in its active portion of the PWM drive signal when one or more of the other lighting fixtures 10 are operating in their inactive portions of the PWM drive signal. As such, the horizontal bands 82 will be lightened due to light being present in the room at all times, even when certain lighting fixtures 10 are operating in the inactive portions of the PWM drive signal. A discussion related to how the lighting fixtures 10 communicate with one another and other devices is provided further below.

In a seventh technique, the camera 14 or an associated device is able to monitor the captured video and analyze the horizontal bands 82 that appear in the captured video. In particular, the captured video is analyzed to identify the horizontal bands 82 and the integration time or frame rate used by the camera 14 are adjusted to eliminate, or at least reduce, the impact of the horizontal bands 82. In more sophisticated embodiments, the horizontal bands 82 are identified and characterized, wherein the characterization dictates whether and how much to increase or decrease the integration time or frame rate being used by the camera 14. In one embodiment, the camera 14 may execute a calibration routine wherein the integration time, the frame rate, or a combination thereof are cycled through acceptable integration time and frame rate ranges. The resulting video is analyzed with the knowledge of the particular integration time, frame rate, or both that were used at any given time during the video. The camera 14 may determine and use the integration time, frame rate, or combination thereof that either eliminates banding altogether or results in banding with the least negative impact on the viewing experience. When choosing the integration time or frame rate that provides the least negative impact, different banding characteristics may be valued differently by different people. For example, one group of people may prefer darker bands that do not move over lighter bands that crawl. Another group may feel the opposite. Regardless of the particular characteristics, this and the other techniques described herein afford designers, installers, and users great flexibility in minimizing the impact of banding.

Notably, any of the above techniques as well as any techniques described further below for reducing or eliminating banding are useful in environments where still or video cameras are used in conjunction with lighting fixtures 10. The still or video cameras may be provided in the same general environment as the lighting fixtures 10 as well as be integrated into the lighting fixtures 10, as will be described further below.

Figure 9:
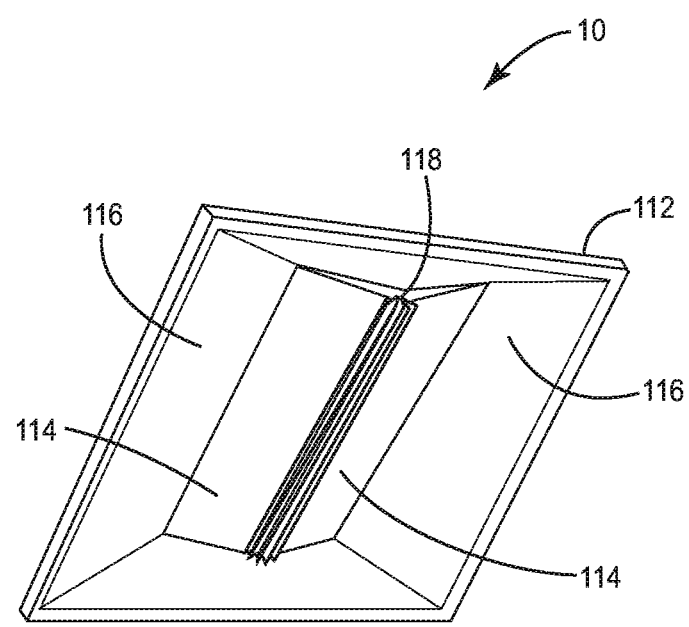
FIG. 9 is a perspective view of a troffer-based lighting fixture according to one embodiment of the disclosure.
Figure 10:
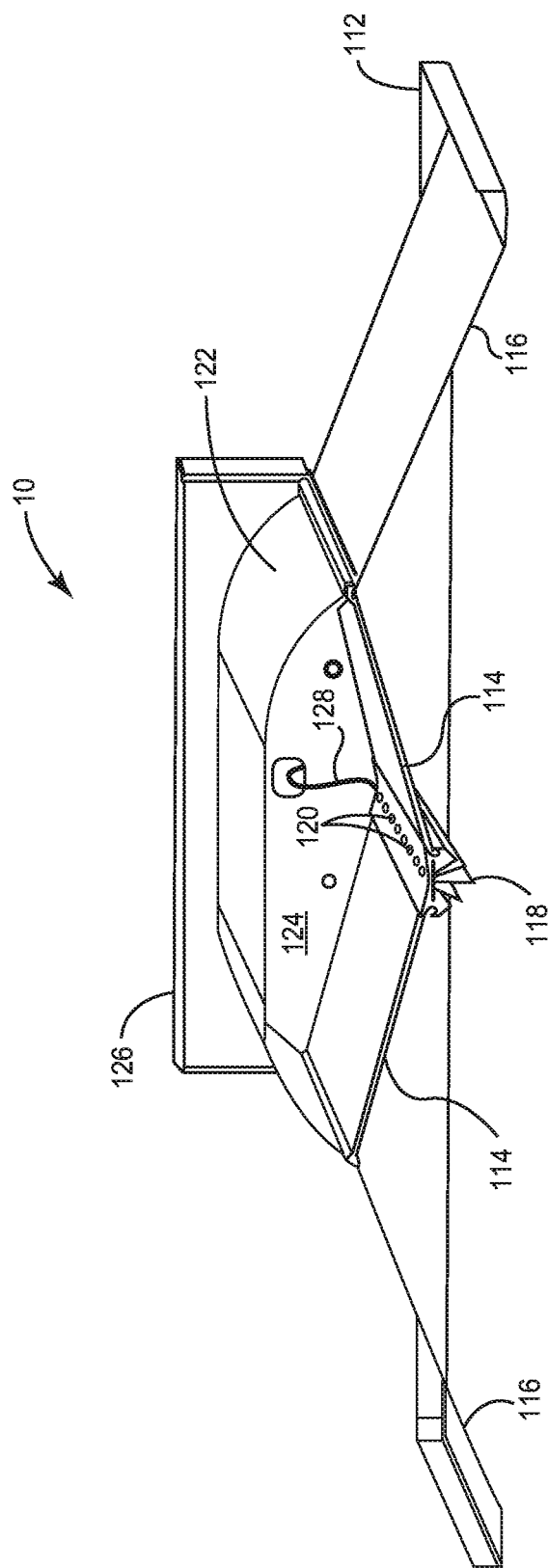
FIG. 10 is a cross-section of the lighting fixture of FIG. 9.
Figure 11:
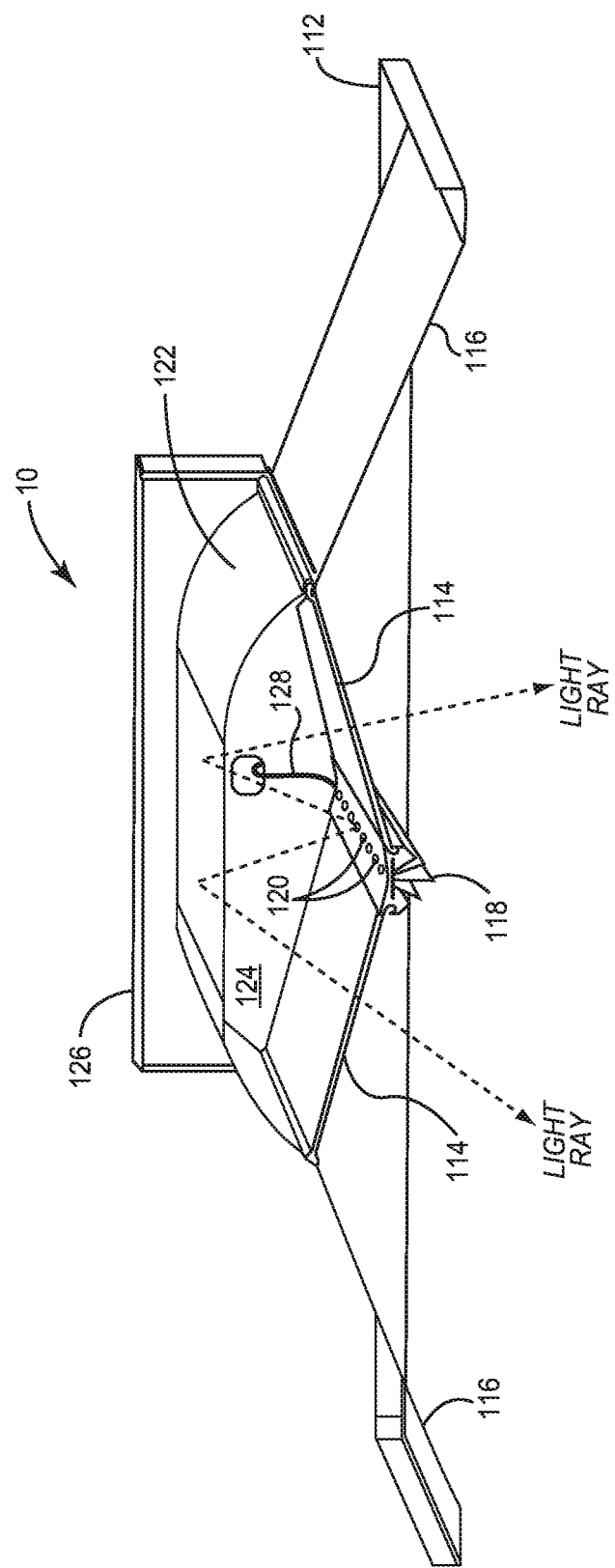
FIG. 11 is a cross-section of the lighting fixture of FIG. 9 illustrating how light emanates from the LEDs of the lighting fixture and is reflected out through lenses of the lighting fixture.

While the concepts of the present disclosure may be employed in any type of lighting system, the immediately following description describes these concepts in a troffer-type lighting fixture, such as the lighting fixture 10 illustrated in FIGS. 9-11. This particular lighting fixture is substantially similar to the CR and CS series of troffer-type lighting fixtures that are manufactured by Cree, Inc. of Durham, N.C.

While the disclosed lighting fixture 10 employs an indirect lighting configuration wherein light is initially emitted upward from a light source and then reflected downward, direct lighting configurations may also take advantage of the concepts of the present disclosure. In addition to troffer-type lighting fixtures, the concepts of the present disclosure may also be employed in recessed lighting configurations, wall mount lighting configurations, outdoor lighting configurations, and the like. Reference is made to co-pending and co-assigned U.S. patent application Ser. No. 13/589,899 filed Aug. 20, 2013, now U.S. Pat. No. 10,219,338, and Ser. No. 13/649,531 filed Oct. 11, 2012, and U.S. Pat. No. 8,829,800, the contents of which are incorporated herein by reference in their entireties. Further, the functionality and control techniques described below may be used to control different types of lighting fixtures, as well as different groups of the same or different types of lighting fixtures at the same time.

In general, troffer-type lighting fixtures, such as the lighting fixture 10, are designed to mount in, on, or from a ceiling. In most applications, the troffer-type lighting fixtures are mounted into a drop ceiling (not shown) of a commercial, educational, or governmental facility. As illustrated in FIGS. 9-11, the lighting fixture 10 includes a square or rectangular outer frame 112. In the central portion of the lighting fixture 10 are two rectangular lenses 114, which are generally transparent, translucent, or opaque. Reflectors 116 extend from the outer frame 112 to the outer edges of the lenses 114. The lenses 114 effectively extend between the innermost portions of the reflectors 116 to an elongated heatsink 118, which functions to join the two inside edges of the lenses 114.

Turning now to FIGS. 10 and 11 in particular, the back side of the heatsink 118 provides a mounting structure for a solid-state light source, such as an LED array 120, which includes one or more rows of individual LEDs mounted on an appropriate substrate. The LEDs are oriented to primarily emit light upwards toward a concave cover 122. The volume bounded by the cover 122, the lenses 114, and the back of the heatsink 118 provides a mixing chamber 124. As such, light will emanate upwards from the LEDs of the LED array 120 toward the cover 122 and will be reflected downward through the respective lenses 114, as illustrated in FIG. 11. Notably, not all light rays emitted from the LEDs will reflect directly off of the bottom of the cover 122 and back through a particular lens 114 with a single reflection. Many of the light rays will bounce around within the mixing chamber 124 and effectively mix with other light rays, such that a desirably uniform light is emitted through the respective lenses 114.

Those skilled in the art will recognize that the type of lenses 114, the type of LEDs, the shape of the cover 122, and any coating on the bottom side of the cover 122, among many other variables, will affect the quantity and quality of light emitted by the lighting fixture 10. As will be discussed in greater detail below, the LED array 120 may include LEDs of different colors, wherein the light emitted from the various LEDs mixes together to form a white light having a desired characteristic, such as spectral content (color or color temperature), color rendering index (CRI), output level, and the like based on the design parameters for the particular embodiment, environmental conditions, or the like.

As is apparent from FIGS. 10 and 11, the elongated fins of the heatsink 118 may be visible from the bottom of the lighting fixture 10. Placing the LEDs of the LED array 120 in thermal contact along the upper side of the heatsink 118 allows any heat generated by the LEDs to be effectively transferred to the elongated fins on the bottom side of the heatsink 118 for dissipation within the room in which the lighting fixture 10 is mounted. Again, the particular configuration of the lighting fixture 10 illustrated in FIGS. 9-11 is merely one of the virtually limitless configurations for lighting fixtures 10 in which the concepts of the present disclosure are applicable.

Figure 12:
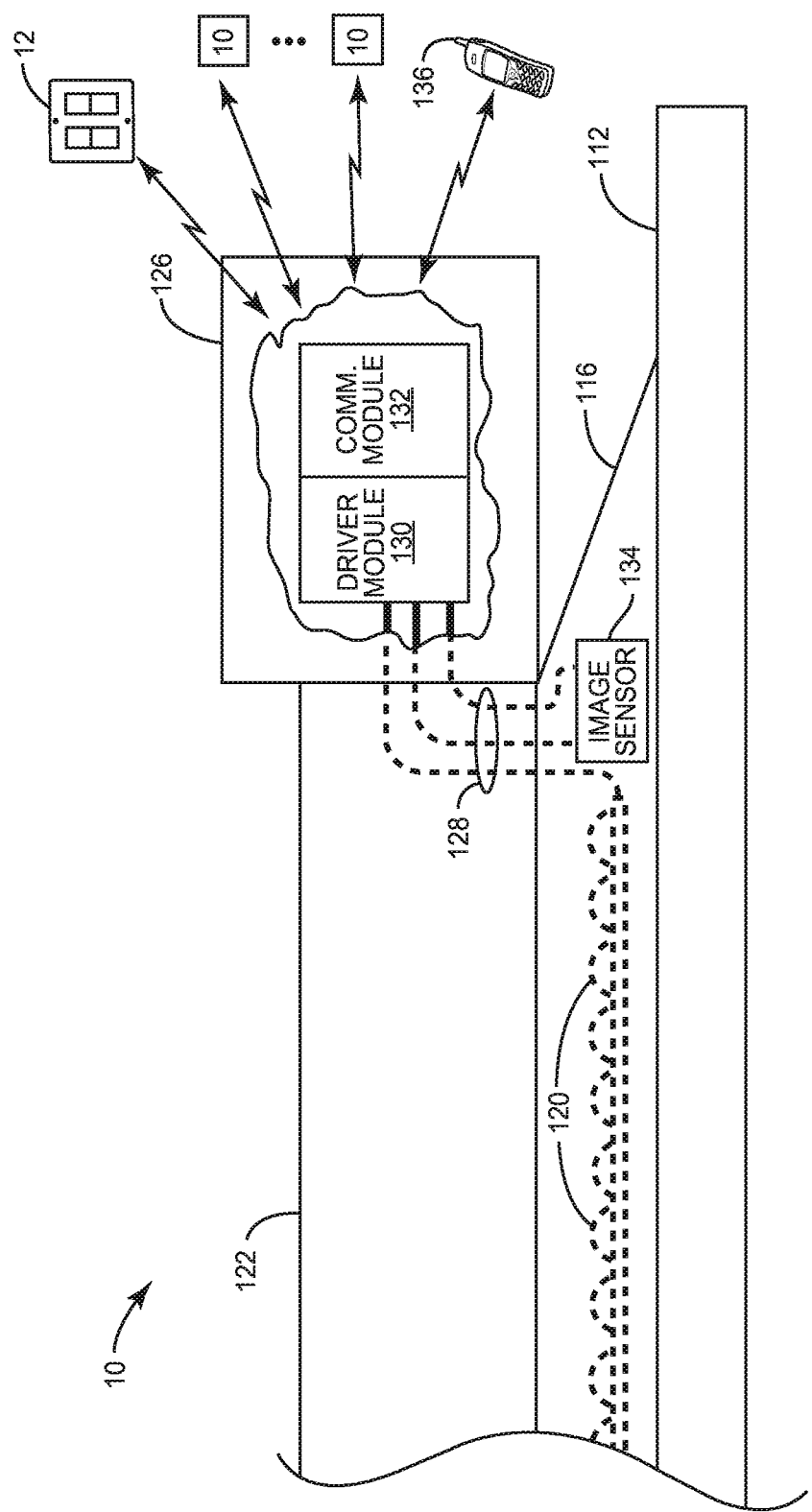
FIG. 12 illustrates a driver module and a communications module integrated within an electronics housing of the lighting fixture of FIG. 9, according to a first embodiment.

With reference to FIG. 12, an electronics housing 126 is shown mounted at one end of the lighting fixture 10, and is used to house all or a portion of the control circuitry used to control the LED array 120 and interface with various sensors, such ambient light sensors, occupancy sensors, or an image sensor 134, which is illustrated. The image sensor 134 may be a CCD (charge-coupled device), CMOS (complementary metal-oxide semiconductor) or like image sensor that is capable of capturing still images or video. In one embodiment, the image sensor 134 is oriented in the lighting fixture 10 and configured to capture a field of view that generally corresponds to an area that is illuminated by light emitted from the lighting fixture 10. The image sensor 134 and its potential uses are described in further detail below. The control circuitry is coupled to the LED array 120 and the image sensor 134 through appropriate cabling 128. As illustrated, the control circuitry is provided by a driver module 130, a communications module 132, or a combination thereof, but can be implemented in a variety of ways as those skilled in the art will appreciate.

In this embodiment, the driver module 130 is coupled to the LED array 120 through the cabling 128 and directly drives the LEDs of the LED array 120 based on information provided by the communications module 132 and perhaps information garnered from the image data obtained from the image sensor 134. In one embodiment, the driver module 130 provides the primary intelligence for the lighting fixture 10 and is capable of driving the LEDs of the LED array 120 in a desired fashion. The driver module 130 may be provided on a single, integrated module or divided into two or more sub-modules depending on the desires of the designer.

When the driver module 130 provides the primary intelligence for the lighting fixture 10, the communications module 132 acts primarily as a wireless communication interface that facilitates communications between the driver module 130 and any number of devices that reside in or associate with the lighting system, videoconferencing system, remote control entities, and the like. For the lighting system, wired or wireless communications may be provided with other lighting fixtures 10, the wall controller 12, the border router 24, a remote control system (not shown), or a portable handheld commissioning tool 136. For the videoconferencing system, wired or wireless communications may be provided with the VC controller 26, control module 18, and the like.

Figure 13:
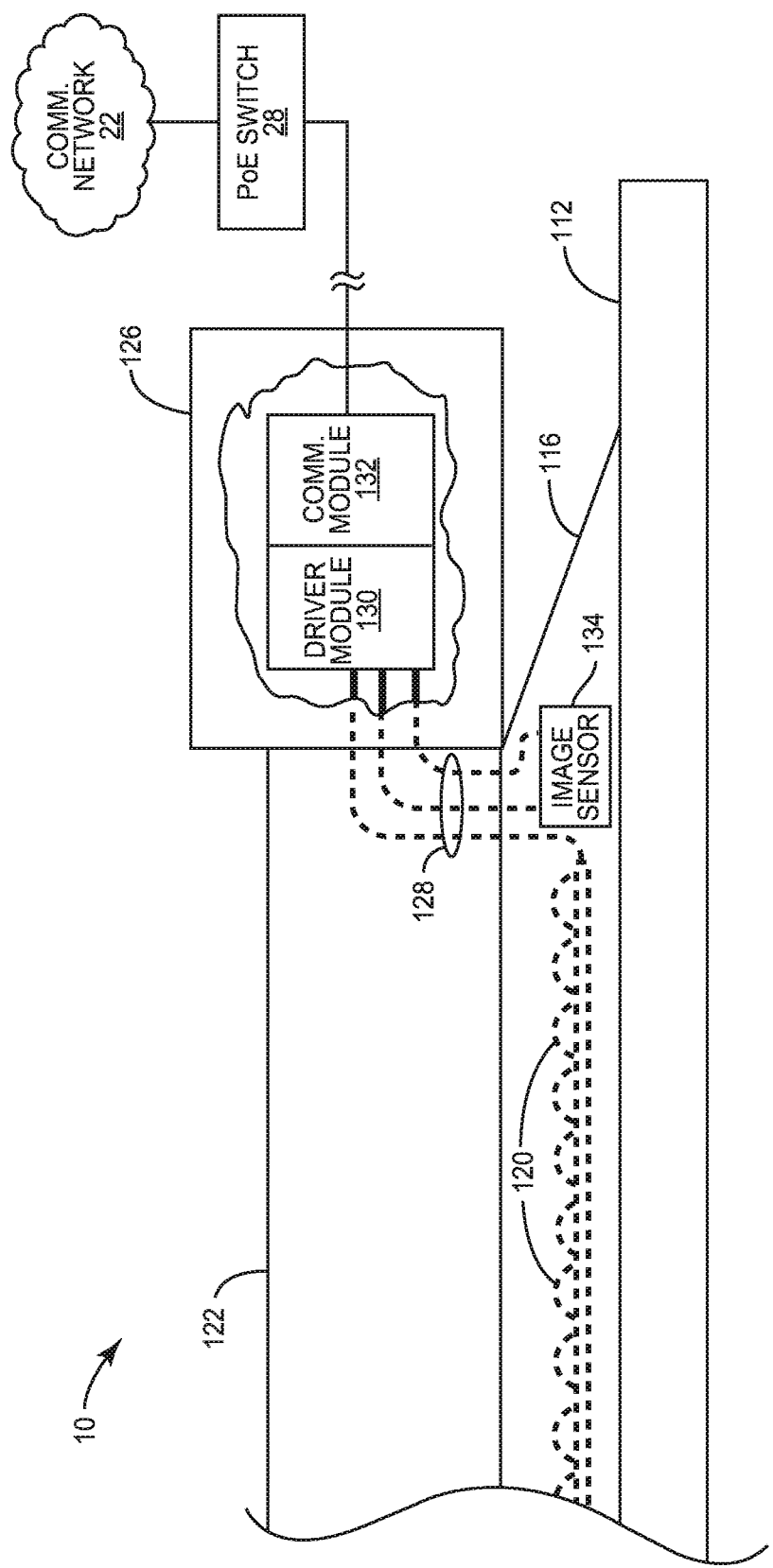
FIG. 13 illustrates a driver module and a communications module integrated within an electronics housing of the lighting fixture of FIG. 9, according to a second embodiment.

As illustrated in FIG. 13, the communication module 132 may primarily act as a wired communication interface, and in this particular embodiment, a PoE communication interface. In such an embodiment, the communication module 132 is coupled to the PoE switch 28, which is coupled to the communication network 22. Power for the lighting fixture 10 may also be received through the Ethernet cabling that connects the communication module 132 to the PoE switch 28.

In an alternative embodiment, the primary intelligence for the lighting fixture 10 may be provided in the communication module 132. As such, the driver module 130 is primarily configured to drive the LEDs of the LED array 120 based simply on instructions from the communications module 132. The lighting fixture 10 may share and exchange image data, instructions, and any other data with other lighting fixtures 10, wall controllers 12, and border routers 24 in the lighting network or with the other remote entities noted above. In essence, the communications module 132 facilitates the sharing of intelligence and data among the lighting fixtures 10 and other entities, and in certain embodiments, may be the primary controller for the lighting fixture 10.

Figure 14:
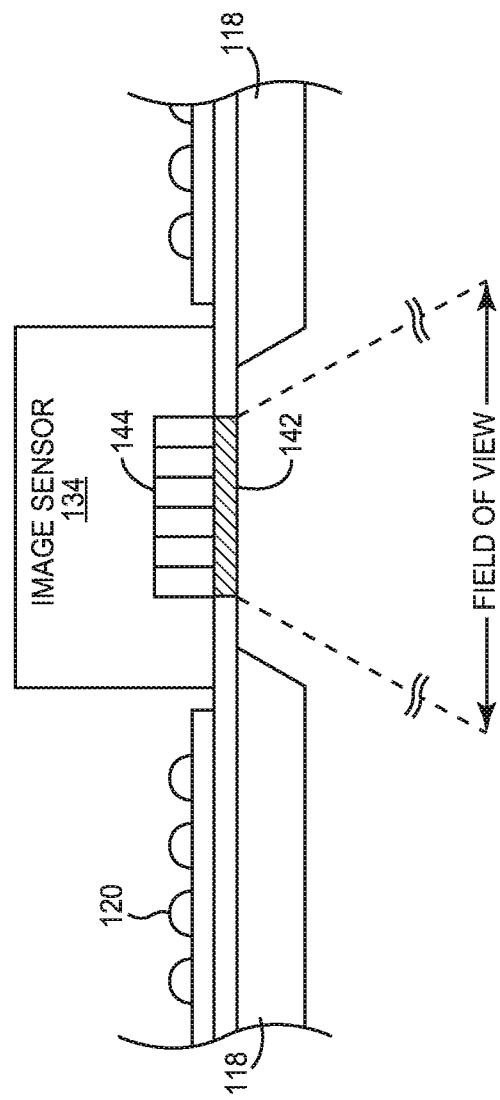
FIGS. 14 and 15 illustrate an image module installed in a heatsink of a lighting fixture according to one embodiment of the disclosure.
Figure 15:
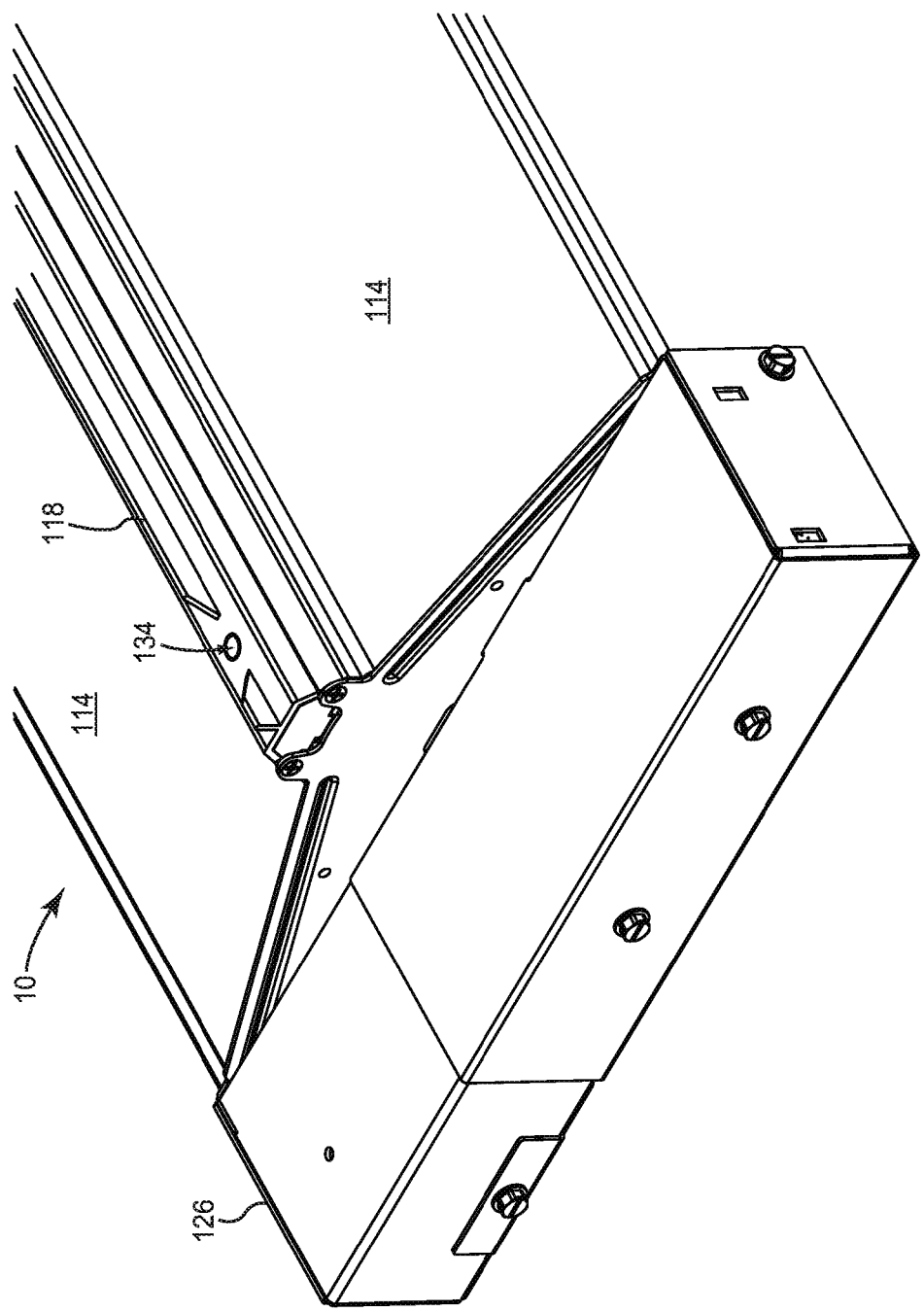

With reference to FIGS. 14 and 15, one embodiment of the lighting fixture 10 is illustrated where the image sensor 134 is integrated with the heatsink 118. The image sensor 134 is shown mounted to the back (top) side of the heatsink 118 along with the LED array 120. A lens 142 or opening is provided in the heatsink 118 such that the front surface of the lens 142 is flush with the front surface of the heatsink 118.

A pixel array 144 of the image sensor 134 is aligned with the lens 142 such that the pixel array 144 is exposed to a field of view through the lens 142 in the heatsink 118. As illustrated, a portion of the heatsink 118 is contoured to accommodate the lens 142 and ensure that the field of view is not obstructed. Notably, the image sensor 134 need not be mounted to the heatsink 118. The image sensor 134 may be mounted on any part of the lighting fixture 10 that affords the pixel array 144 access to an appropriate field of view.

Figure 16:
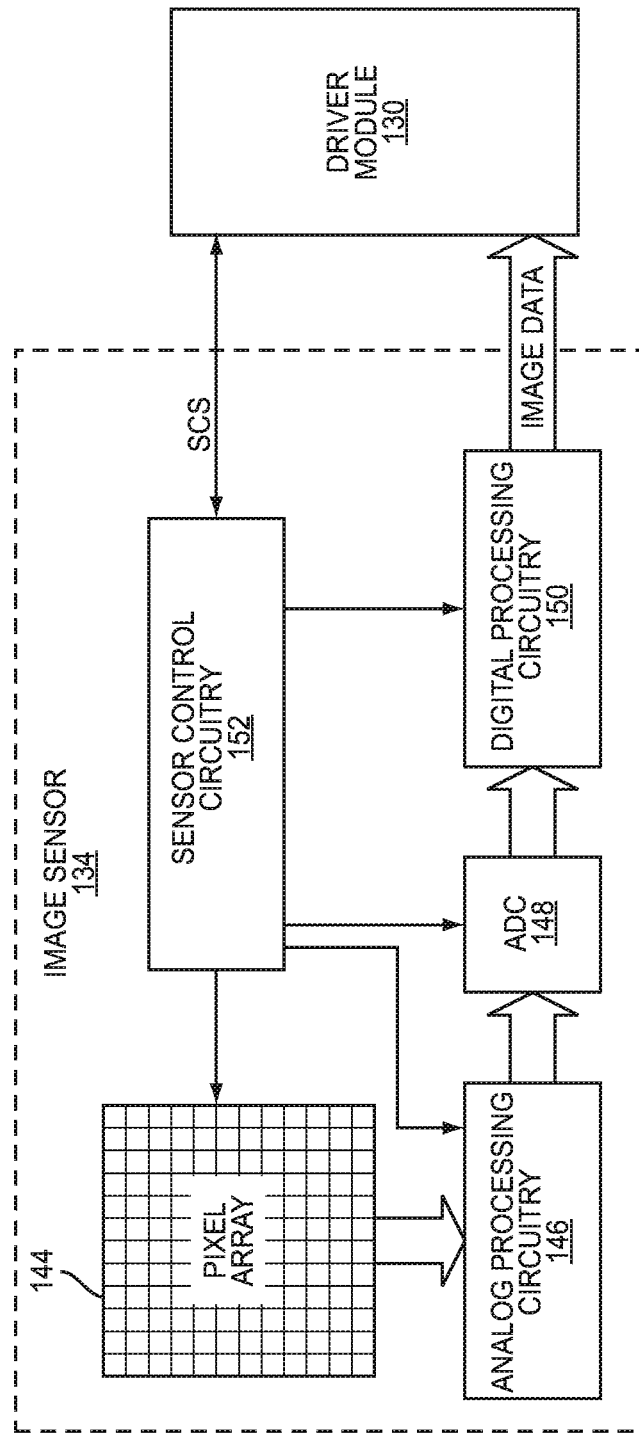
FIG. 16 illustrates an image sensor according to one embodiment of the disclosure.

An exemplary CMOS-based image sensor 134 is shown in FIG. 16. The image sensor 134 may be very similar to the image sensor 64, which resides in the camera 14. While a CMOS-based image sensor 134 is illustrated, those skilled in the art will appreciate that other types of image sensors 134, such as CCD-based sensors, may be employed.

The image sensor 134 generally includes the pixel array 144, analog processing circuitry 146, an analog-to-digital converter (ADC) 148, digital processing circuitry 150, and sensor control circuitry 152. In operation, the pixel array 144 will receive an instruction to capture an image from the sensor control circuitry 152. In response, the pixel array 144 will transform the light that is detected at each pixel into an analog signal and pass the analog signals for each pixel of the pixel array 144 to the analog processing circuitry 146. The analog processing circuitry 146 will filter and amplify the analog signals to create amplified signals, which are converted to digital signals by the ADC 148. The digital signals are processed by the digital processing circuitry 150 to create image data for the captured image. The image data is passed to the driver module 130 for analysis, storage, or delivery to another lighting fixture 10 or remote entity via the communications module 132.

The sensor control circuitry 152 will cause the pixel array 144 to capture an image in response to receiving an instruction via a sensor control signal (SCS) from the driver module 130 or other control entity. The sensor control circuitry 152 controls the timing of the image processing provided by the analog processing circuitry 146, ADC 148, and digital processing circuitry 150. The sensor control circuitry 152 also sets the image sensor's processing parameters, such as the integration time, gain, and nature of filtering provided by the analog processing circuitry 146 as well as the type of image processing provided by the digital processing circuitry 150. These processing parameters may be dictated by information provided by the driver module 130.

Figure 17:
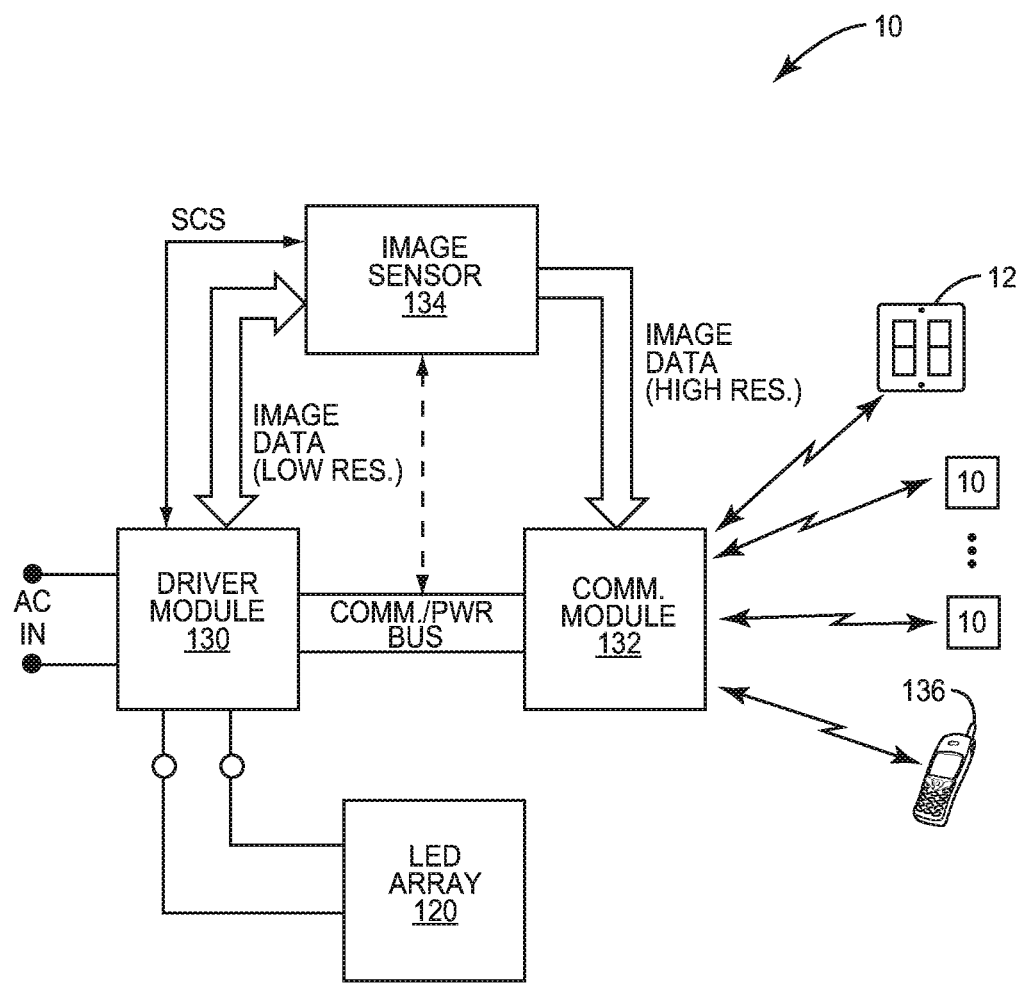
FIG. 17 is a block diagram of a lighting system according to one embodiment of the disclosure.

Turning now to FIG. 17, an electrical block diagram of a lighting fixture 10 is provided according to one embodiment. Assume for purposes of discussion that the driver module 130, communications module 132, and LED array 120 are ultimately connected to form the core electronics of the lighting fixture 10, and that the communications module 132 is configured to bidirectionally communicate with other lighting fixtures 10, the wall controller 12, the commissioning tool 136, elements of the video conferencing system, or other control entity through wired or wireless techniques. In this embodiment, a standard communication interface and a first, or standard, protocol are used between the driver module 130 and the communications module 132. This standard protocol allows different driver modules 130 to communicate with and be controlled by different communications modules 132, assuming that both the driver module 130 and the communications module 132 are operating according to the standard protocol used by the standard communication interface. The term "standard protocol" is defined to mean any type of known or future developed, proprietary, or industry-standardized protocol.

In the illustrated embodiment, the driver module 130 and the communications module 132 are coupled via communication and power buses, which may be separate or integrated with one another. The communication bus allows the communications module 132 to receive information from the driver module 130 as well as control the driver module 130. An exemplary communication bus is the well-known inter-integrated circuitry ($I^2C$) bus, which is a serial bus and is typically implemented with a two-wire interface employing data and clock lines. Other available buses include: serial peripheral interface (SPI) bus, Dallas Semiconductor Corporation's 1-Wire serial bus, universal serial bus (USB), RS-232, Microchip Technology Incorporated's UNI/O®, and the like.

In certain embodiments, the driver module 130 includes sufficient electronics to process an alternating current (AC) input signal (AC IN) and provide an appropriate rectified or direct current (DC) signal sufficient to power the communications module 132, and perhaps the LED array 120. As such, the communications module 132 does not require separate AC-to-DC conversion circuitry to power the electronics residing therein, and can simply receive DC power from the driver module 130 over the power bus. Similarly, the image sensor 134 may receive power directly from the driver module 130 or via the power bus, which is powered by the driver module 130 or other source. The image sensor 134 may also be coupled to a power source (not shown) independently of the driver and communications modules 130, 132.

In one embodiment, one aspect of the standard communication interface is the definition of a standard power delivery system. For example, the power bus may be set to a low voltage level, such as 5 volts, 12 volts, 24 volts, or the like. The driver module 130 is configured to process the AC input signal to provide the defined low voltage level and provide that voltage over the power bus. Thus, the communications module 132 or auxiliary devices, such as the image sensor 134, may be designed in anticipation of the desired low voltage level being provided over the power bus by the driver module 130 without concern for connecting to or processing an AC signal to a DC power signal for powering the electronics of the communications module 132 or the image sensor 134.

Figure 18:
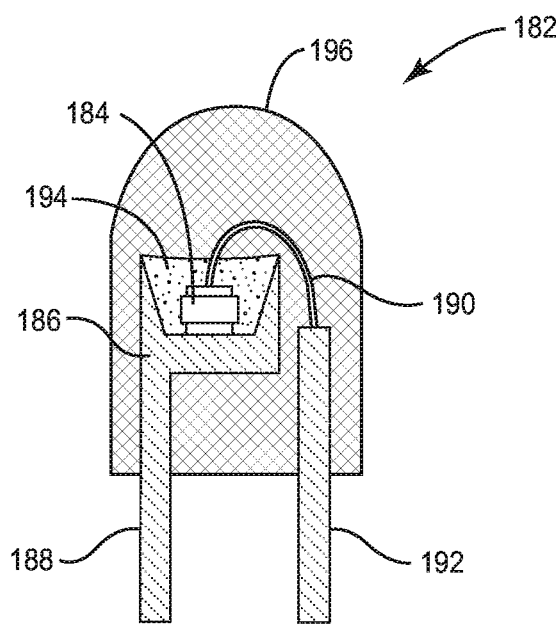
FIG. 18 is a cross-section of an exemplary LED according to a first embodiment of the disclosure.

A description of an exemplary embodiment of the LED array 120, driver module 130, and the communications module 132 follows. As noted, the LED array 120 includes a plurality of LEDs, such as the LEDs 182 illustrated in FIGS. 18 and 19. With reference to FIG. 18, a single LED chip 184 is mounted on a reflective cup 186 using solder or a conductive epoxy, such that ohmic contacts for the cathode (or anode) of the LED chip 184 are electrically coupled to the bottom of the reflective cup 186. The reflective cup 186 is either coupled to or integrally formed with a first lead 188 of the LED 182. One or more bond wires 190 connect ohmic contacts for the anode (or cathode) of the LED chip 184 to a second lead 192.

The reflective cup 186 may be filled with an encapsulant material 194 that encapsulates the LED chip 184. The encapsulant material 194 may be clear or may contain a wavelength conversion material, such as a phosphor, which is described in greater detail below. The entire assembly is encapsulated in a clear protective resin 196, which may be molded in the shape of a lens to control the light emitted from the LED chip 184.

Figure 19:
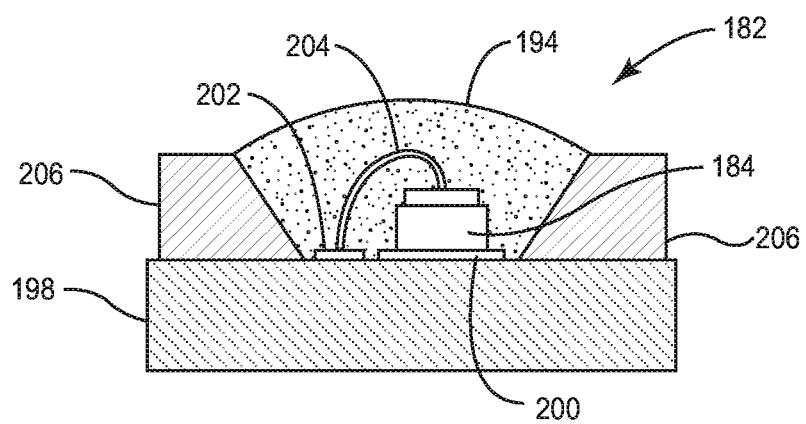
FIG. 19 is a cross-section of an exemplary LED according to a second embodiment of the disclosure.

An alternative package for an LED 182 is illustrated in FIG. 19 wherein the LED chip 184 is mounted on a substrate 198. In particular, the ohmic contacts for the anode (or cathode) of the LED chip 184 are directly mounted to first contact pads 200 on the surface of the substrate 198. The ohmic contacts for the cathode (or anode) of the LED chip 184 are connected to second contact pads 202, which are also on the surface of the substrate 198, using bond wires 204. The LED chip 184 resides in a cavity of a reflector structure 206, which is formed from a reflective material and functions to reflect light emitted from the LED chip 184 through the opening formed by the reflector structure 206. The cavity formed by the reflector structure 206 may be filled with an encapsulant material 194 that encapsulates the LED chip 184. The encapsulant material 194 may be clear or may contain a wavelength conversion material, such as a phosphor.

In either of the embodiments of FIGS. 18 and 19, if the encapsulant material 194 is clear, the light emitted by the LED chip 184 passes through the encapsulant material 194 and the protective resin 196 without any substantial shift in color. As such, the light emitted from the LED chip 184 is effectively the light emitted from the LED 182. If the encapsulant material 194 contains a wavelength conversion material, substantially all or a portion of the light emitted by the LED chip 184 in a first wavelength range may be absorbed by the wavelength conversion material, which will responsively emit light in a second wavelength range. The concentration and type of wavelength conversion material will dictate how much of the light emitted by the LED chip 184 is absorbed by the wavelength conversion material as well as the extent of the wavelength conversion. In embodiments where some of the light emitted by the LED chip 184 passes through the wavelength conversion material without being absorbed, the light passing through the wavelength conversion material will mix with the light emitted by the wavelength conversion material. Thus, when a wavelength conversion material is used, the light emitted from the LED 182 is shifted in color from the actual light emitted from the LED chip 184.

For example, the LED array 120 may include a group of BSY (blue-shifted yellow) or BSG (blue-shifted green) LEDs 182 as well as a group of red LEDs 182. BSY LEDs 182 include an LED chip 184 that emits bluish light, and the wavelength conversion material is a yellow phosphor that absorbs the blue light and emits yellowish light. Even if some of the bluish light passes through the phosphor, the resultant mix of light emitted from the overall BSY LED 182 is yellowish light. The yellowish light emitted from a BSY LED 182 has a color point that falls above the Black Body Locus (BBL) on the 1976 CIE chromaticity diagram, wherein the BBL corresponds to the various color temperatures of white light.

Similarly, BSG LEDs 182 include an LED chip 184 that emits bluish light; however, the wavelength conversion material is a greenish phosphor that absorbs the blue light and emits greenish light. Even if some of the bluish light passes through the phosphor, the resultant mix of light emitted from the overall BSG LED 182 is greenish light. The greenish light emitted from a BSG LED 182 has a color point that falls above the BBL on the 1976 CIE chromaticity diagram.

The red LEDs 182 generally emit reddish light at a color point on the opposite side of the BBL as the yellowish or greenish light of the BSY or BSG LEDs 182. As such, the reddish light from the red LEDs 182 may mix with the yellowish or greenish light emitted from the BSY or BSG LEDs 182 to generate white light that has a desired color temperature and falls within a desired proximity of the BBL. In effect, the reddish light from the red LEDs 182 pulls the yellowish or greenish light from the BSY or BSG LEDs 182 to a desired color point on or near the BBL. Notably, the red LEDs 182 may have LED chips 184 that natively emit reddish light wherein no wavelength conversion material is employed. Alternatively, the LED chips 184 may be associated with a wavelength conversion material, wherein the resultant light emitted from the wavelength conversion material and any light that is emitted from the LED chips 184 without being absorbed by the wavelength conversion material mixes to form the desired reddish light.

The blue LED chip 184 used to form either the BSY or BSG LEDs 182 may be formed from a gallium nitride (GaN), indium gallium nitride (InGaN), silicon carbide (SiC), zinc selenide (ZnSe), or like material system. The red LED chip 184 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like.

The above LED architectures, phosphors, and material systems are merely exemplary and are not intended to provide an exhaustive listing of architectures, phosphors, and materials systems that are applicable to the concepts disclosed herein. For example, an embodiment described further below employs the combination of BSY or BSG LEDs 182 and BSR (blue-shifted red) LEDs 182. The BSR LEDs 182 include an LED chip 184 that emits bluish light; however, the wavelength conversion material is a reddish phosphor that absorbs the blue light and emits reddish light. Even if some of the bluish light passes through the phosphor, the resultant mix of light emitted from the overall BSR LED 182 is reddish light at a color point on the opposite side of the BBL as the yellowish or greenish light of the BSY or BSG LEDs 182. As such, the reddish light from the BSR LEDs 182 may mix with the yellowish or greenish light emitted from the BSY or BSG LEDs 182 to generate white light that has a desired color temperature and falls within a desired proximity of the BBL.

The blue LED chip 184 used to form either the BSY or BSG LEDs 182 may be formed from a gallium nitride (GaN), indium gallium nitride (InGaN), silicon carbide (SiC), zinc selenide (ZnSe), or like material system. Notably, a benefit of using InGaN for the BSY, BSG, and BSR LEDs 182 is the stability of color over varying levels of drive currents. Suitable red phosphors include $CaAlSiN_3$:$Eu^{2+}$ and $Sr_2Si_5N_8$:$Eu^{2+}$. This phosphor can maintain a quantum efficiency greater than 80% at temperatures above 150° C. Other red phosphors that can be used include phosphors from the $Eu^{2+}$—SiAlON family of phosphors, as well as $CaSiN_2$:$Ce^{3+}$, $CaSiN_2$:$Eu^{2+}$ and/or phosphors from the $(Ca,Si,Ba)SiO_4$:$Eu^{2+}$ (BOSE) family. For further information on BSR LEDs 182, please refer to U.S. Pat. No. 8,898,444, which is incorporated herein by reference.

Figure 20:
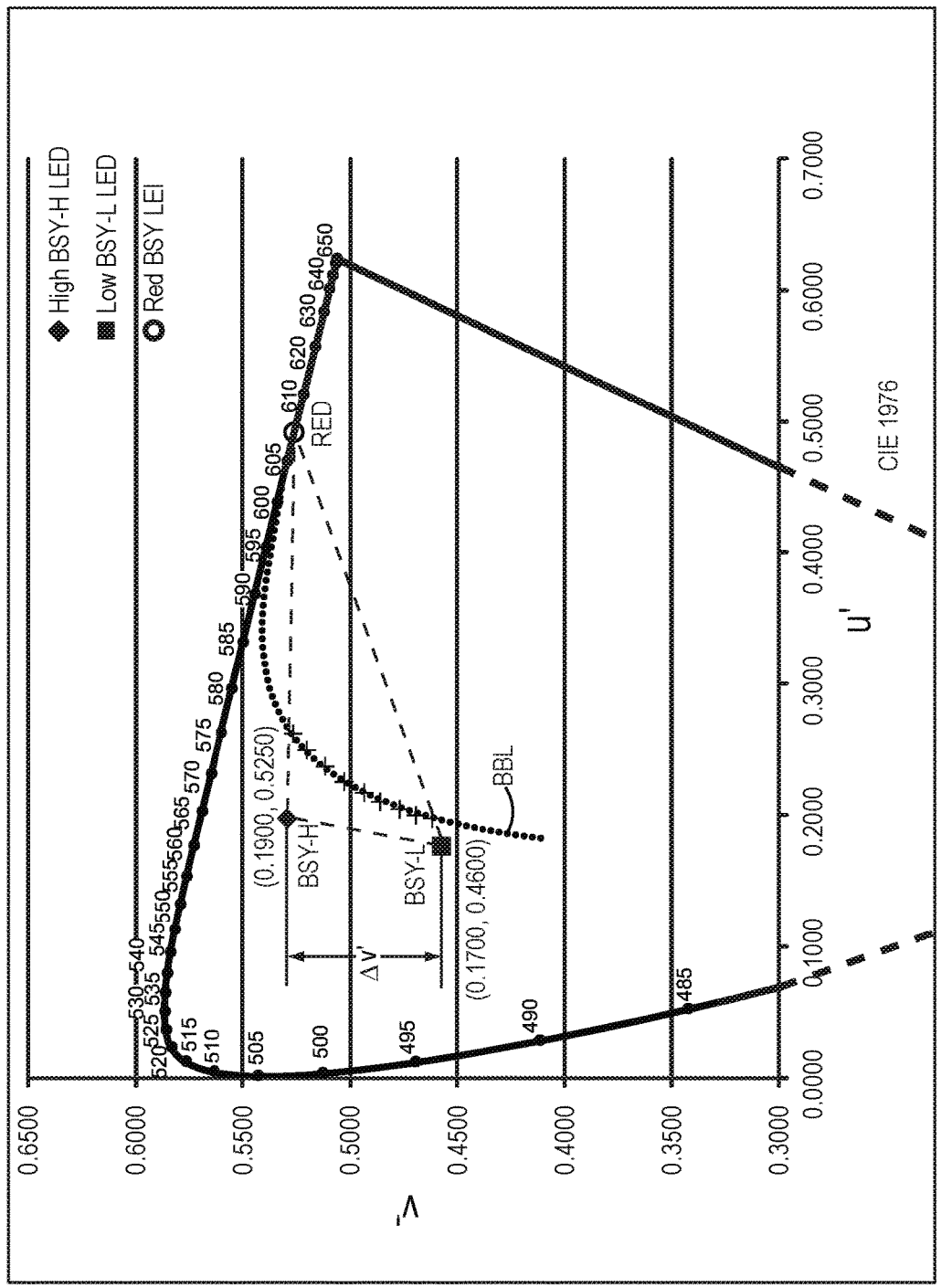
FIG. 20 is CIE 1976 chromaticity diagram that illustrates the color points for three different LEDs and a black body locus.

The International Commission on Illumination (Commission internationale de l'eclairage, or CIE) has defined various chromaticity diagrams over the years. The chromaticity diagrams are used to project a color space that represents all human perceivable colors without reference to brightness or luminance. The CIE 1976 chromaticity diagram, which is illustrated in FIG. 20, includes the BBL, which is the path within the color space that the color of an incandescent black body would travel as the temperature of the black body changes. While the color of the incandescent body may range from an orangish-red to blue, the middle portions of the path encompass a range that is traditionally considered as "white light."

Correlated Color Temperature (CCT), or color temperature, is used to characterize white light. CCT is measured in kelvin (K) and defined by the Illuminating Engineering Society of North America (IESNA) as "the absolute temperature of a blackbody whose chromaticity most nearly resembles that of the light source." Light output that is:

below 3200 K is a yellowish white and generally considered to be warm (white) light;

between 3200 K and 4000 K is generally considered neutral (white) light; and above 4000 K is bluish-white and generally considered to be cool (white) light.

In most residential, commercial, and industrial lighting applications, the focus is providing white light with a desired CCT for general illumination. However, the concepts discussed herein equally apply to adjusting the overall color of the light provided by the lighting fixture 10 to colors that are not considered white or have color points that do not fall on or relatively close to the BBL.

The coordinates [u', v'] are used to define color points within the color space of the CIE 1976 chromaticity diagram. The v' value defines a vertical position and the u' value defines a horizontal position. As an example, the color points for a first BSY LED 182 is about (0.1900, 0.5250), a second BSY LED 182 is about (0.1700, 0.4600), and a red LED 182 is about (0.4900, 0.5600). Notably, the first and second BSY LEDs 182 are spaced apart from one another along the v' axis. As such, the first BSY LED 182 is higher than the second BSY LED 182 in the chromaticity diagram. For ease of reference, the higher, first BSY LED 182 is referenced as the high BSY-H LED, and the lower, second BSY LED 182 is referenced as the low BSY-L LED.

As such, the Δv' for the high BSY-H LED and the low BSY-L LED is about 0.065 in the illustrated example. In different embodiments, the Δv' may be greater than 0.025, 0.030, 0.033, 0.040 0.050, 0.060, 0.075, 0.100, 0.110, and 0.120, respectively. Exemplary, but not absolute upper bounds for Δv' may be 0.150, 0.175, or 0.200 for any of the aforementioned lower bounds. For groups of LEDs of a particular color, the Δv' between two groups of LEDs is the difference between the average v' values for each group of LEDs. As such, the Δv' between groups of LEDs of a particular color may also be greater than 0.030, 0.033, 0.040 0.050, 0.060, 0.075, 0.100, 0.110, and 0.120, respectively, with the same upper bounds as described above. Further, the variation of color points among the LEDs 182 within a particular group of LEDs may be limited to within a seven, five, four, three, or two-step MacAdam ellipse in certain embodiments. In general, the greater the delta v', the larger the range through which the CCT of the white light can be adjusted along the black body locus. The closer the white light is to the black body locus, the more closely the white light will replicate that of an incandescent radiator.

In one embodiment, the LED array 120 includes a first LED group of only low BSY-L LEDs, a second LED group of only high BSY-H LEDs, and a third LED group of only red LEDs. The currents used to drive the first, second, and third LED groups may be independently controlled such that the intensity of the light output from the first, second, and third LED groups is independently controlled. As such, the light output for the first, second, and third LED groups may be blended or mixed to create a light output that has an overall color point virtually anywhere within a triangle formed by the color points of the respective low BSY-L LEDs, high BSY-H LEDs, and the red LEDs. Within this triangle resides a significant portion of the BBL, and as such, the overall color point of the light output may be dynamically adjusted to fall along the portion of the BBL that resides within the triangle (as well as virtually anywhere within the triangle).

A crosshatch pattern highlights the portion of the BBL that falls within the triangle. Adjusting the overall color point of the light output along the BBL corresponds to adjusting the CCT of the light output, which as noted above is considered white light when falling on or close to the BBL. In one embodiment, the CCT of the overall light output may be adjusted over a range from about 2700 K to about 5700 K. In another embodiment, the CCT of the overall light output may be adjusted over a range from about 3000 K to 5000 K. In yet another embodiment, the CCT of the overall light output may be adjusted over a range from about 2700 K to 5000 K. In yet another embodiment, the CCT of the overall light output may be adjusted over a range from about 3000 K to 4000 K. These variations in CCT can be accomplished while maintaining a high color rendering index value (CRI), such as a CRI equal to or greater than 90.

To be considered "white" light, the overall color point does not have to fall precisely on the BBL. Unless defined otherwise and for the purposes of this application only, a color point within a five-step MacAdam ellipse of the BBL is defined as white light on the BBL. For tighter tolerances, four, three, and two-step MacAdam ellipses may be defined.

Figure 21:
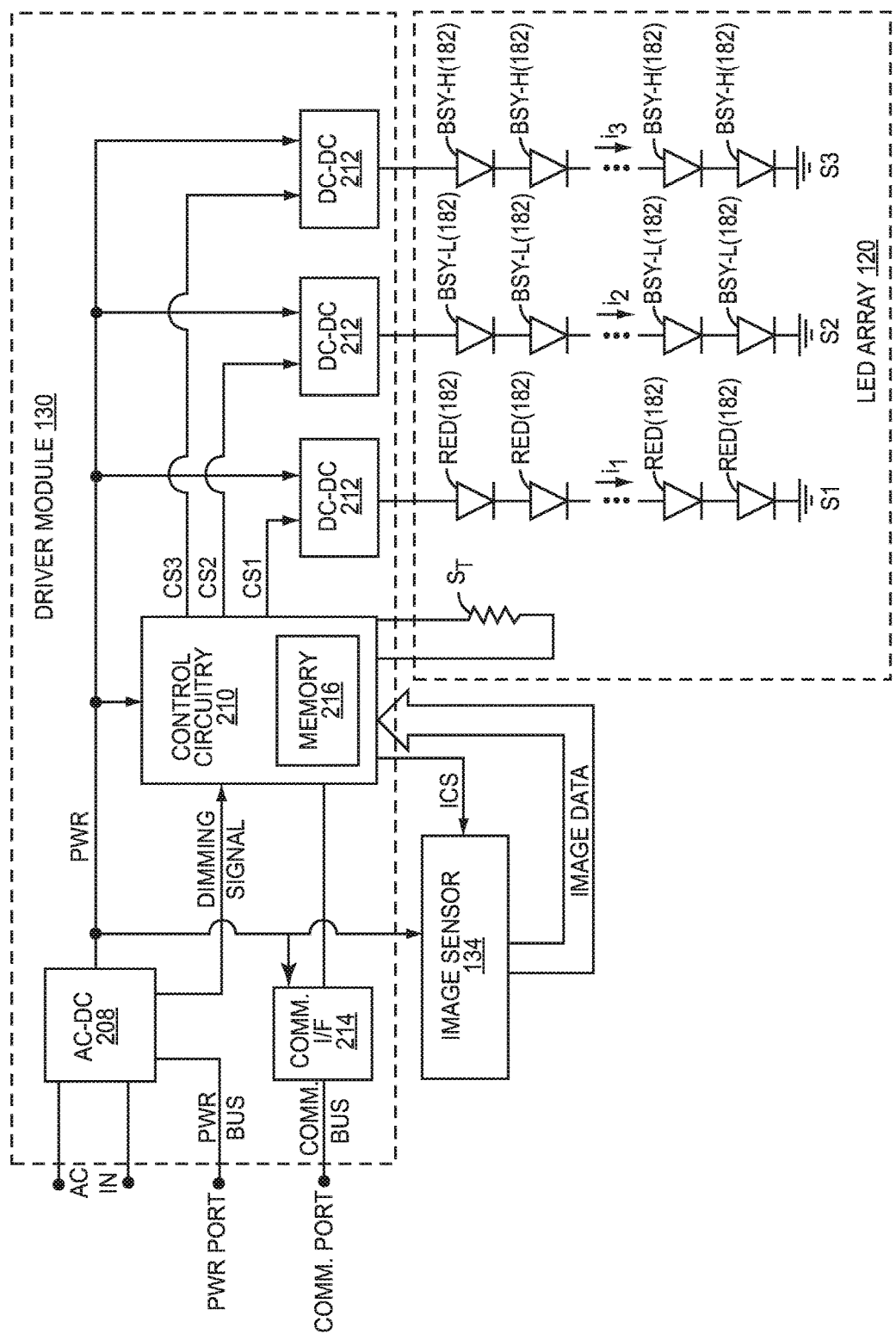
FIG. 21 is a schematic of a driver module with an image sensor and an LED array according to a first embodiment of the disclosure.

In the illustrated embodiment, the LED array 120 may include a mixture of red LEDs 182, high BSY-H LEDs 182, and low BSY-L LEDs 182. The driver module 130 for driving the LED array 120 is illustrated in FIG. 21, according to one embodiment of the disclosure. The LED array 120 may be divided into multiple strings of series connected LEDs 182. In essence, LED string S1, which includes a number of red LEDs (RED), forms a first group of LEDs 182. LED string S2, which includes a number of low BSY LEDs (BSY-L), forms a second group of LEDs 182. LED string S3, which includes a number of high BSY LEDs (BSY-H), forms a third group of LEDs 182.

For clarity, the various LEDs 182 of the LED array 120 are referenced as RED, BSY-L, and BSY-H in FIG. 21 to clearly indicate which LEDs are located in the various LED strings S1, S2, and S3. While BSY LEDs 182 are illustrated, BSG or other phosphor-coated, wavelength converted LEDs may be employed in analogous fashion. For example, a string of high BSG-H LEDs 182 may be combined with a string of low BSG-L LEDs 182, and vice versa. Further, a string of low BSY-H LEDs may be combined with a string of high BSG-H LEDs, and vice versa. Non-phosphor-coated LEDs, such as non-wavelength converted red, green, and blue LEDs, may also be employed in certain embodiments.

The driver module 130 controls the PWM drive currents $i_1$, $i_2$, and $i_3$, which are PWM and used to drive the respective LED strings S1, S2, and S3. During the active portions of the PWM drive current $i_X$, current will flow through the respective LED strings S1, S2, and S3 of the LED array 120, and as such, the LED array 120 will emit light. During the inactive portions of the PWM drive current $i_X$, current will not flow through the LED strings S1, S2, and S3, and as such, the LED array 120 will not emit light.

Changing the duty cycle of any one of the PWM drive currents $i_1$, $i_2$, and $i_3$, changes the relative intensity of light emitted from the corresponding LED string Sx. The ratio of PWM drive currents $i_1$, $i_2$, and $i_3$ that are provided through respective LED strings S1, S2, and S3 may be adjusted to effectively control the relative intensities of the reddish light emitted from the red LEDs 182 of LED string S1, the yellowish/greenish light emitted from the low BSY-L LEDs 182 of LED string S2, and the yellow/greenish light emitted from the high BSY-H LEDs 182 of LED string S3. The resultant light from each LED string S1, S2, and S3 mixes to generate an overall light output that has a desired color, CCT, and intensity, the latter of which may also be referred to as a dimming level. As noted, the overall light output may be white light that falls on or within a desired proximity of the BBL and has a desired CCT.

The number of LED strings Sx may vary from one to many and different combinations of LED colors may be used in the different strings. Each LED string Sx may have LEDs 182 of the same color, variations of the same color, or substantially different colors. In the illustrated embodiment, each LED string S1, S2, and S3 is configured such that all of the LEDs 182 that are in the string are all essentially identical in color. However, the LEDs 182 in each string may vary substantially in color or be completely different colors in certain embodiments. In another embodiment, three LED strings Sx with red, green, and blue LEDs may be used, wherein each LED string Sx is dedicated to a single color. In yet another embodiment, at least two LED strings Sx may be used, wherein the same or different colored BSY or BSG LEDs are used in one of the LED strings Sx and red LEDs are used in the other of the LED strings Sx. A single string embodiment is also envisioned, where currents may be individually adjusted for the LEDs of the different colors using bypass circuits, or the like.

The driver module 130 depicted in FIG. 21 generally includes AC-DC conversion circuitry 208, control circuitry 210, and a number of current sources, such as the illustrated DC-DC converters 212. The AC-DC conversion circuitry 208 is adapted to receive an AC power signal (AC IN), rectify the AC power signal, correct the power factor of the AC power signal, and provide a DC output signal. The DC output signal may be used to directly power the control circuitry 210 and any other circuitry provided in the driver module 130, including the DC-DC converters 212, a communication interface 214, as well as the image sensor 134.

The DC output signal may also be provided to the power bus, which is coupled to one or more power ports, which may be part of the standard communication interface. The DC output signal provided to the power bus may be used to provide power to one or more external devices that are coupled to the power bus and separate from the driver module 130. These external devices may include the communications module 132 and any number of auxiliary devices, such as the image sensor 134. Accordingly, these external devices may rely on the driver module 130 for power and can be efficiently and cost effectively designed accordingly. The AC-DC conversion circuitry 208 of the driver module 130 is robustly designed in anticipation of being required to supply power to not only its internal circuitry and the LED array 120, but also to supply power to these external devices. Such a design greatly simplifies the power supply design, if not eliminating the need for a power supply, and reduces the cost for these external devices.

As illustrated, the three respective DC-DC converters 212 of the driver module 130 provide PWM drive currents $i_1$, $i_2$, and $i_3$ for the three LED strings S1, S2, and S3 in response to control signals CS1, CS2, and CS3. The control signals CS1, CS2, and CS3 may be pulse width modulated (PWM) signals that effectively turn the respective DC-DC converters 212 on during a logic high state and off during a logic low state of each period of the PWM signal. In one embodiment, the control signals CS1, CS2, and CS3 are the product of two PWM signals.

The first PWM signal is a higher frequency PWM signal that has a duty cycle that effectively sets the DC current level through a corresponding one of LED strings S1, S2, and S3, when current is allowed to pass through the LED strings S1, S2, and S3. The second PWM signal is a lower frequency signal that has a duty cycle that corresponds a desired dimming or overall output level. In essence, the higher frequency PWM signal sets the relative current levels though each LED string S1, S2, and S3 while the lower frequency PWM signal determines how long the PWM drive currents $i_1$, $i_2$, and $i_3$ are allowed to pass through the LED strings S1, S2, and S3 during each period of the lower frequency PWM signal. The longer the PWM drive currents $i_1$, $i_2$, and $i_3$ are allowed to flow through the LED strings S1, S2, and S3 during each period, the higher the output level, and vice versa.

Given the reactive components associated with the DC-DC converters 212, the relative current levels set with the higher frequency PWM signals are filtered to a relative DC current. However, this DC current is essentially pulsed on and off based on the duty cycle of the lower frequency PWM signal.

For example, the higher frequency PWM signal may have a switching frequency of around 200 KHz, while the lower frequency PWM signal may have a switching frequency of around 1 KHz or less. FIG. 22 illustrates a control signal $CS_X$, which has the higher and lower frequency PWM components, and a resultant PWM drive current (or signal) $i_X$. In this example, the PWM period is highlighted, and the duty cycle is approximately 50%. During the active portions of the PWM drive current $i_X$, current will flow through the LED array 120, and as such, the LED array 120 will emit light. During the inactive portions PWM drive current $i_X$, current will not flow through the LED array 120, and as such, the LED array 120 will not emit light.

As noted above, the PWM period for the PWM drive signal may be selected or controlled to facilitate image capture in an environment that is at least partially illuminated by the lighting fixture 10. The image capture may be still or video, and the image capture device may be the camera 14 residing in the environment, as well as the image sensor 134, which may be integrated into the lighting fixture 10. A first technique, which is illustrated in FIG. 8A, controls the PWM period of the PWM drive signal such that the frame period for the camera 14 is an integer multiple of the PWM period of the PWM drive signal. In other words, the frequency of the PWM signal is an integer multiple of the frame rate.

A second technique, which is illustrated in FIG. 8B, controls the PWM period of the PWM drive signal such that the integration time for the image sensor 64 of the camera 14 is an integer multiple of the PWM period of the PWM drive signal. A third technique is illustrated in FIG. 8C. For the third technique, the magnitude of the inactive portion of the PWM drive signal is not dropped to zero. Instead, the magnitude of the inactive portion of the PWM drive signal merely drops to a lower level, which is referred to as a base level. The base level may vary from application to application, but is intended to keep a defined minimum amount of current flowing through the LEDs of the lighting fixture 10 at all times.

For a fourth technique, which is illustrated in FIG. 8D, the PWM drive signal transitions from a PWM signal to a non-PWM, DC (direct current) signal during a videoconference (VC) mode. The VC mode may also be referred to generally as a non-PWM mode. As such, the lighting fixture 10 will drive the LEDs with a PWM signal during a normal mode and drive the LEDs with a non-PWM signal during non-PWM mode. Dimming during the normal mode is facilitated by varying the duty cycle of the PWM signal. Dimming during the non-PWM mode is facilitated by varying the magnitude of the DC signal.

A fifth technique effectively changes the drive signals that are provided to the LEDs of the lighting fixture 10 to variable DC signals, which are not pulsed width modulated. In essence, the lighting fixture 10 will operate continuously in the same manner as described for the non-PWM mode of the fourth technique. This technique has proven to be particularly beneficial when used with certain types of LEDs, as is described further below in association with FIG. 25.

A sixth technique relies on the PWM drive signals of the various lighting fixtures 10 in the videoconferencing environment to be intentionally out of phase with one another, such that the PWM drive signals of the various lighting fixtures 10 are not synchronized.

Another phase-related technique is to offset the PWM periods for each of the PWM drive currents $i_1$, $i_2$, and $i_3$, such that each of the each LED strings S1, S2, and S3 are driven out of phase with each other. For example, is the PWM period for each of the PWM drive currents $i_1$, $i_2$, and $i_3$ is x, the PWM periods for each of the PWM drive currents $i_1$, $i_2$, and $i_3$ are offset by 1/x. If there are three LED strings, each of the PWM drive currents $i_1$, $i_2$, and $i_3$ are offset from another by ⅓ of a PWM period. If there are four LED strings Sx, each of the PWM drive currents $i_x$ are offset from another by ¼ of a PWM period. This can be applied to any number strings or groups of LEDs.

Offsetting the PWM drive signals for the various LED strings Sx not only functions to reduce banding, but also reduces flicker, reduces stroboscopic effect, and increases the effective PWM frequency of the PWM drive signals. The phase shifting does three things. First, it reduces the amount of total led off time by spreading out the on times across the PWM period. Second, it lowers the magnitude of the times that the LED strings Sx are on because light is additive, and if the LED strings Sx are on at different times then the magnitude is cut down Third, it increases the effective PWM dim frequency by having x light pulses per period instead of 1 per period. These combine to reduce aliasing for imaging systems, reduce flicker, and make flicker less visible.

A seventh technique is described in association with the embodiment of FIGS. 23 and 24. In this embodiment, each of the PWM drive currents $i_1$, $i_2$, and $i_3$ is filtered using filter circuitry F1, F2, F3, respectively. In particular, filter circuitry F1 is coupled across the red LEDs 182 of LED string S1, filter circuitry F2 is coupled across the BSY-L LEDs 182 of string S2, and filter circuitry F3 is coupled across the BSY-H LEDs 182 of string S3. In operation, the DC-DC converters 212 are controlled to provide PWM drive currents $i_1$, $i_2$, and $i_3$; however, the respective filter circuitry F1, F2, and F3 provide low-pass filtering of the PWM drive currents $i_1$, $i_2$, and $i_3$. As a result, PWM drive currents $i_1$, $i_2$, $i_3$ are filtered to a DC signal with significant ripple as illustrated in FIG. 24. The ripple may be upwards of 50%, or more, of the root mean square (RMS) value of the associated signals. With increased capacitance, the ripple may be reduced to much lower levels. These design decisions may be based on size, cost, efficiency, performance, and the like. In one embodiment, the PWM drive currents $i_1$, $i_2$, and $i_3$ and filtering provided by the filter circuitries F1, F2, and F3 are configured to ensure continuous current flow through the LED strings S1, S2, and S3, regardless of dimming level, when the lighting fixture is in the on state. Further, this embodiment may be combined with the fourth technique, wherein the filter circuitries F1, F2, and F3 are selectively switched into the circuit during the VC or non-PWM mode.

Figure 25:
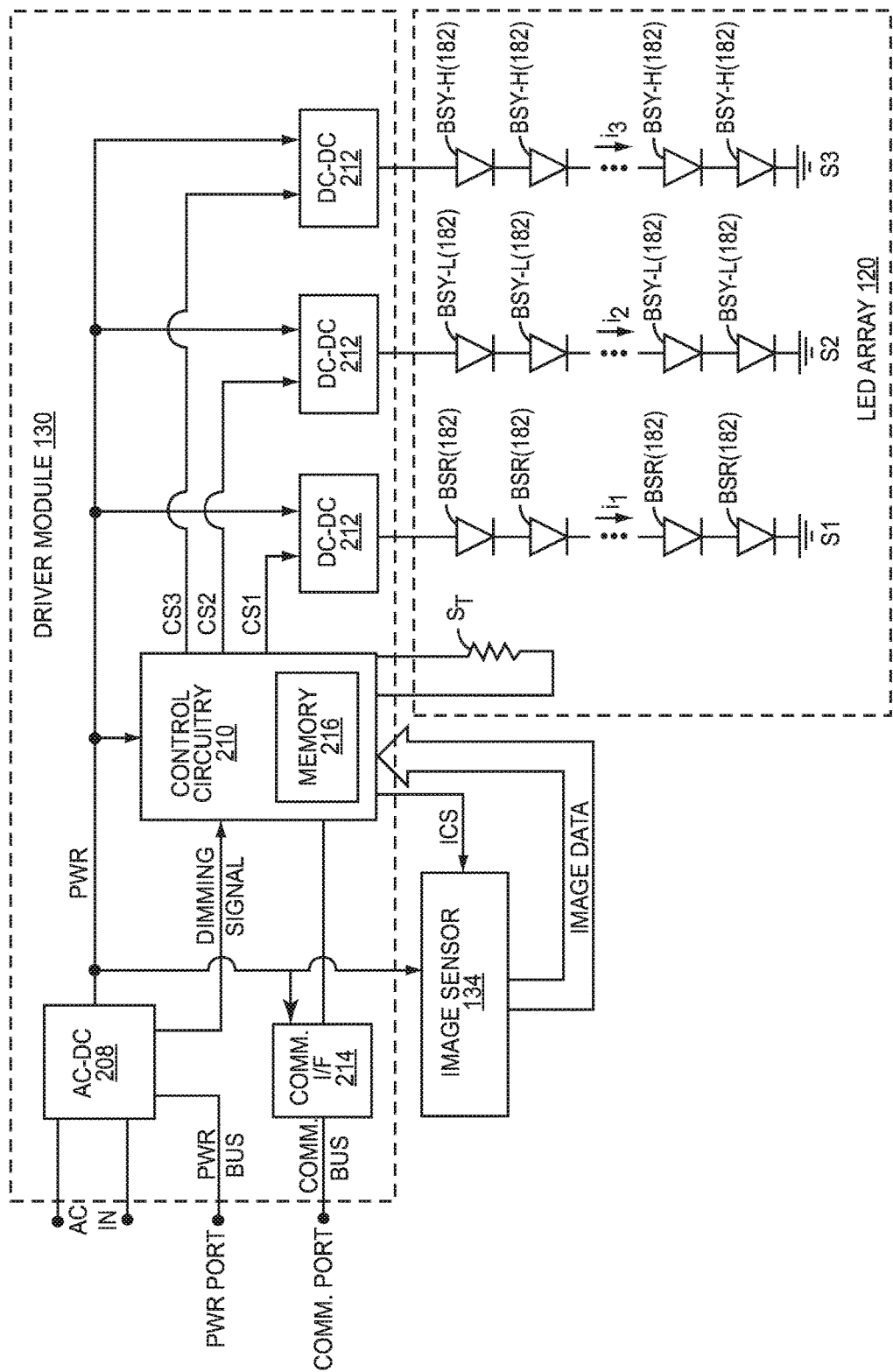
FIG. 25 is a schematic of a driver module with an image sensor and an LED array according to a third embodiment of the disclosure.

For an eighth technique, the control circuitry 210 and DC-DC converter circuitries 212 provide variable DC currents for drive currents $i_1$, $i_2$, and $i_3$, instead of PWM currents, as provided in FIG. 25. Dimming is provided by varying the magnitude of these DC currents. Since traditional, non-phosphor converted, red LEDs 182 tend to shift color points as the magnitude of DC drive currents change, one embodiment of the disclosure employs BSR LEDs 182. As described above, the BSR LEDs 182 are phosphor converted blue LEDs that emit reddish light. A benefit of using InGaN-based BSR LEDs 182 is the stability of color over varying levels of drive current. This is in contrast to traditional, non-phosphor converted, red LEDs 182, which rely on a red LED chip 184 and tend to shift in color as the drive currents vary. Further, the BSY LEDs 182 (as well as BSG LEDs 182, if provided) may also be formed from the InGaN material system and provide stable yellowish and greenish light with varying drive currents. Suitable red phosphors for the InGaN-based BSR LEDs 182 include $CaAlSiN_3:Eu^{2+}$ and $Sr_2Si_5N_8:Eu^{2+}$. Other red phosphors that can be used include phosphors from the $Eu^{2+}$—SiAlON family of phosphors, as well as $CaSiN_2:Ce^{3+}$, $CaSiN_2:Eu^{2+}$ and/or phosphors from the $(Ca,Si,Ba)SiO_4:Eu^{2+}$ (BOSE) family.

Accordingly, a particularly beneficial embodiment involves the driver module 130 providing variable DC drive currents $i_1$, $i_2$, and $i_3$, to the LED strings S1, S2, and S3, and the LED strings S1, S2, and S3 including a combination of BSR LEDs 182 and BSY (and/or BSG) LEDs 182, as illustrated in FIG. 25. In such an embodiment, variable dimming and CCT are available and accurately controllable over a relatively wide range of intensity levels and CCTs. Further, the CRI is greater than 90, which translates to a lighting fixture 10 that is not only capable of providing high-quality light over varying intensity levels and CCTs, but is also highly compatible with all types of image capture devices. The intensity levels may range from 10% (or lower) to 100%. The CCT may be variable from 2700 K or 3000 K to at least 5000 K. For further information on BSR LEDs 182, please refer to U.S. Pat. No. 8,898,444, which is incorporated herein by reference.

In yet another technique, various other settings in the camera 14 may be adjusted to cause the camera 14 to have longer integration times. For example, the camera 14 may limit gain to a gain threshold, which is lower than the available gain for the camera 14. Generally, gain and integration times are inversely proportional to one another. Therefore, limiting gain to a reduced, gain threshold will force the camera to employ longer integration times. Similarly, the camera 14 may impose a minimum integration time, which is lower than the available integration time for the camera 14. In general, the longer the integration time, the lower the amplitude of the banding. Gain and integration times are generally part of the auto exposure (AE) settings for the camera 14.

As described above, a dimming signal or instruction may be provided to the lighting fixture 10 in a variety of ways. Based on the dimming signal, the control circuitry 210 will adjust the PWM drive currents $i_1$, $i_2$, and $i_3$ provided to each of the LED strings S1, S2, and S3 to effectively reduce the intensity of the resultant light emitted from the LED strings S1, S2, and S3 while maintaining the desired CCT. The PWM drive currents $i_1$, $i_2$, and $i_3$ are adjusted by adjusting the respective duty cycles. As described further below, the color, CCT and dimming levels may be initiated internally or received from the commissioning tool 136, a wall controller 12, another lighting fixture 10, or a remote control entity. If received from an external device via the communications module 132, the color, CCT and/or dimming levels are delivered from the communications module 132 to the control circuitry 210 of the driver module 130 in the form of a command via the communication bus. The driver module 130 will respond by controlling the PWM drive currents $i_1$, $i_2$, and $i_3$ in the desired manner to achieve the requested color, CCT and/or dimming levels.

The color, CCT, and intensity of the light emitted from the LEDs 182 may be affected by temperature. If associated with a thermistor $S_T$ or other temperature-sensing device, the control circuitry 210 can control the drive currents $i_1$, $i_2$, and $i_3$ provided to each of the LED strings S1, S2, and S3 based on ambient temperature of the LED array 120 in an effort to compensate for temperature effects. The control circuitry 210 may also trigger still or video image capture by and receive image data from the image sensor 134. The image data may be processed by the control circuitry 210 to make occupancy determinations, determine ambient light levels, and control the PWM drive currents $i_1$, $i_2$, and $i_3$ in a desired fashion based on the occupancy conditions and ambient light levels. Each of the LED strings S1, S2, and S3 may have different temperature compensation adjustments, which may also be functions of the duty cycles of the various PWM drive currents $i_1$, $i_2$, and $i_3$.

The control circuitry 210 may include a central processing unit (CPU, not shown) and sufficient memory 216 to enable the control circuitry 210 to bidirectionally communicate with the communications module 132 or other devices over the communication bus through an appropriate communication interface (I/F) 214 using a defined protocol, such as the standard protocol described above. The control circuitry 210 may receive data or instructions from the communications module 132 or other device and take appropriate action to process the data and implement the received instructions. The instructions may range from controlling how the LEDs 182 of the LED array 120 are driven to returning operational data, such as image, temperature, occupancy, light output, or ambient light information, that was collected by the control circuitry 210 to the communications module 132 or other device via the communication bus. Notably, the functionality of the communications module 132 may be integrated into the driver module 130, and vice versa.

Notably, when the term "control system" is used in the claims or generically in the specification, this term should be construed broadly to include the hardware and any additional software or firmware that is needed to provide the stated functionality. The term "control system" should not be construed as only software, as electronics are needed to implement any control system that is defined herein. For example, a control system of the lighting fixture 10 may, but does not necessarily, include the control circuitry 210, the DC-DC converters 212, the AC-DC conversion circuitry 208, and the like.

For occupancy or ambient light sensing, the image sensor 134 may be configured to capture still images or video (image data), and the control circuitry 210 may process the image data to determine an occupancy state, a change in an occupancy state, a relative or actual ambient light level, and the like. As such, the image sensor 134 may replace a traditional occupancy detector, ambient light sensor, or both. For occupancy detection, periodically captured images or frames in video may be analyzed by the control circuitry 210 to determine whether someone is present or there is movement in a field of view that can be captured by the image sensor 134. For example, still images that are captured over time or video may be analyzed for differences, wherein the presence of differences in successive images/frame as well as differences between a current image/frame and a reference image is indicative of occupancy. A lack of differences in the successive images/frames or between a current image/frame and reference image may be indicative of vacancy, or a lack of occupancy. The extent or type of differences required to be indicative of occupancy or vacancy may be varied to prevent false occupancy and vacancy determinations. Further, areas of the captured image may be ignored to prevent false detections.

If the field of view for the image sensor 134 covers an area of interest and an area of no interest, the portion of the image data that corresponds to the area of no interest may be ignored, while only the portion of the image data that corresponds to the area of interest is analyzed for occupancy and vacancy determinations. For example, if the field of view for the image sensor 134 covers a conference room (an area of interest) and extends through a window to cover an exterior sidewalk (an area of no interest), the portion of the image data that corresponds to the sidewalk or anywhere outside of the conference room may be ignored, while only the portion of the image data that corresponds to conference room is analyzed for occupancy and vacancy determinations.

If the lighting fixture 10 is in an off state in which light is not being emitted for general illumination, the control circuitry 210 may keep the lighting fixture 10 in the off state until occupancy (or motion) is detected. Once occupancy is detected, the control circuitry 210 will transition the lighting fixture 10 to an on state in which light is emitted for general illumination at a desired output level. After occupancy is no longer detected (vacancy), the control circuitry 210 may transition the lighting fixture 10 back to the off state. Various occupancy modes, or operating protocols, are known to those skilled in art.

To use the image sensor 134 for occupancy detection, images may need to be captured when the lighting fixture 10 is in the off state or the on state. In the off state, the lighting fixture 10 may be in an environment that is so dark that images captured by the image sensor 134 are effectively underexposed and have insufficient information to make occupancy decisions. Notably, images are not captured instantly. The image sensor 134 captures each image during a brief image capture period. In the off state, the control circuitry 210 may cause the LED array 120 to emit light for a brief period that substantially coincides with the image capture period. As such, the field of view is illuminated during the image capture period by the light emitted from the LED array 120 to make sure that the captured image is sufficiently exposed and is able to provide sufficient information to make occupancy decisions.

When the lighting fixture 10 is in the off state, the light emitted by the LED array 120 during an image capture period may differ from the light emitted for general illumination during the on state in output level, spectral content, or both. For example, light emitted during the image capture period may be emitted at a lower or higher lumen level than the light emitted for general illumination during the on state. The light emitted during the image capture period may also have a different color spectrum than the light emitted for general illumination during the on state. The different color spectrums may differ in width, location, or both. The different color spectrums may or may not overlap. For instance, the white light for general illumination may reside within a 2- or 4-step MacAdam Ellipse of the Black Body Locus (BBL) and have CCT between 2700 and 5700 K, while the light emitted during the image capture period may be outside of this specification and may be optimized for the image sensor 134.

In one embodiment, the color spectrum for the light emitted during image capture is less visible or perceptible to humans than the light emitted during general illumination. For example, the light emitted during the image capture periods may be shifted toward red or infrared with respect to the color spectrum for the white light emitted during general illumination. In particular, white light may be used for general illumination, while red or infrared light may be used during the image capture periods. As such, the flashes of red or infrared light that occur during the image capture periods in darker or non-illuminated rooms are imperceptible, or at least less perceptible and distracting than if the white light that is emitted for general illumination were used during the image captures periods. The image sensor 134 may have a CCD or CMOS-based sensor and may be responsive to both spectrums. The light emitted during image capture should include, but need not be limited to, light that resides in a spectrum in which the image sensor 134 is responsive.

When the lighting fixture 10 is in the on state, the control circuitry 210 will cause the LED array 120 to emit light at a desired output level, color, CCT, or a combination thereof for general illumination. For occupancy detection in the on state, periodically captured images may be analyzed by the control circuitry 210 to determine whether someone is present or there is movement in a field of view that can be captured by the image sensor 134. Occupancy determinations may dictate whether the lighting fixture 10 remains in the on state or transitions to the off state in traditional fashion. The control circuitry 210 may simply capture these images on a periodic basis while using the same white light that is emitted for general illumination for capturing images.

Alternatively, the control circuitry 210 may cause the LED array 120 to change a characteristic of the light that is emitted for general illumination during the brief image capture periods. The light emitted by the LED array 120 during the image capture periods may differ from the light emitted for general illumination in output level or spectral content. For instance, light emitted during the image capture period may be emitted at a lower or higher lumen level than the light emitted for general illumination. The light emitted during the image capture period may also have a different color spectrum than the light emitted during general illumination. The different color spectrums may differ in width, location, or both, such that the light differs in perceptibility, color, CCT, and the like. The different color spectrums may or may not overlap. For instance, the light for general illumination may reside within a 2- or 4-step MacAdam Ellipse of the Black Body Locus (BBL) and have CCT between 2700 and 5700 K while the light emitted during the image capture period may be outside of a 4-step MacAdam Ellipse of the BBL.

Further, the output level of the light emitted during the image capture periods may be reduced from the output level for general illumination to avoid an overexposed image when the image sensor 134 would be subjected to too much light at the general illumination levels. In contrast, the output level of the light emitted during the image capture periods may be increased from the output level for general illumination to avoid an underexposed image when the image sensor 134 would be subjected to too little light at the general illumination output levels. In the on state, any changes in the characteristics of the light during the image capture periods are preferably imperceptible or minimally perceptible to humans. The changes may be made imperceptible or minimally perceptible because the change in the light is for a relatively short duration that corresponds to the image capture period.

Images may also be captured and analyzed to determine the characteristics of ambient light when light is and is not being emitted from the lighting fixture 10. The characteristics of the ambient light may be used in a variety of ways. For example, the ambient light characteristics may dictate the output level, color spectrum (i.e. color, CCT), or both of the light that is emitted for general illumination, during the image capture periods, or both. As such, the image sensor 134 may be used as an ambient light sensor. The control circuitry 210 can iteratively determine an actual ambient light level during general illumination from the captured images and regulate the output level of the emitted light up or down so that the actual ambient light level corresponds to a reference output level for both general illumination or image capture, even as light from other lighting sources, such as the sun or another lighting fixture 10 changes.

Similarly, the control circuitry 210 can iteratively determine the color spectrum of the ambient light during general illumination from the captured images and regulate the color spectrum of the emitted light so that the color spectrum of the ambient light corresponds to, or is at least shifted in the direction of, a reference color spectrum. The control circuitry 210 can also regulate the color spectrum and level of the emitted light so that the ambient light color spectrum corresponds to the reference color spectrum and the ambient light level corresponds to a reference output level at the same time. When the LED array 120 is emitting light, the ambient light represents a combination of the light emitted from the LED array 120 and any light provided by sources other than the lighting fixture 10.

For ambient light sensing, the images may be captured when light is being emitted from the LED array 120, when light is not being emitted from the LED array 120, or both. Images captured without light being emitted from the LED array 120 will provide ambient light information (i.e. output level, color spectrum) without the lighting contribution of the LED array 120. With this information, the control circuitry 210 can determine an output level, the color spectrum, or both for light to emit to achieve a desired reference when added to the ambient conditions. Alternatively, information from the images captured with light being emitted from the LED array 120 allow the control circuitry 210 to determine how to adjust the light being emitted from the LED array 120 in output level, color spectrum, or both to achieve a desired reference.

The images, information determined from the images, or instructions derived from the images may be sent to other lighting fixtures 10 and remote devices. For example, a first lighting fixture 10 may receive images or image information from one or more other lighting fixtures 10, and use the received images or image information alone or in conjunction with images or image information that was captured by the first lighting fixture 10 to control the light output of the first lighting fixture 10 as well as at least one of the one or more lighting fixtures 10. As such, the light emitted from the first lighting fixture 10 may be further controlled based on images or image information that was gathered from multiple lighting fixtures 10, including the first lighting fixture 10.

Images from the various lighting fixtures 10 may be sent to a central security location for monitoring by security personnel or for storage. As such, the same image sensor 134 may be used as an ambient light sensor, occupancy sensor, and a video or security camera. The images may represent still images as well as full or partial frames of a video.

Those skilled in the art will recognize improvements and modifications to the preferred embodiments of the present disclosure. All such improvements and modifications are considered within the scope of the concepts disclosed herein and the claims that follow.

What is claimed is:

1. A lighting fixture comprising:
a plurality of LEDs providing a light source for general illumination of an environment; and
fixture control circuitry configured to provide a pulse width modulated (PWM) drive signal to at least a portion of the plurality of LEDs, the PWM drive signal having a PWM period and a variable duty cycle wherein varying the duty cycle varies an intensity of light emitted from the plurality of LEDs and during each PWM period the PWM drive signal includes an active portion and an inactive portion such that a magnitude of the active portion is greater than a magnitude of the inactive portion and the magnitude of the inactive portion is greater than zero.

2. The lighting fixture of claim 1 wherein the magnitude of the inactive portion of the PWM drive signal causes a minimum amount of current to flow through the portion of the plurality of LEDs, wherein the minimum amount of current is greater than zero.

3. A camera system comprising:
an image sensor for capturing video of an environment at a frame rate;
camera control circuitry associated with the image sensor and configured to:
detect a pulse width modulated (PWM) period used by at least one lighting fixture that is illuminating the environment via the image sensor; and
control the frame rate of the image sensor such that the PWM period is an integer multiple of a frame period for the frame rate; and
at least one interface configured to output the video.

4. The camera system of claim 3 wherein a multiplier for the integer multiple of the frame period is at least ten (10).

5. The camera system of claim 3 wherein a multiplier for the integer multiple of the frame period is at least fifty (50).

6. The camera system of claim 3 wherein:
the camera control circuitry is configured to dynamically change the frame rate from a first frame rate to a second frame rate, which is different than the first frame rate, while capturing the video; and
the PWM period is a first integer multiple of a first frame period of the first frame rate, and the PWM period is a second integer multiple of a second frame period of the second frame rate.

7. A lighting fixture comprising:
a plurality of LEDs providing a light source for general illumination of an environment; and
fixture control circuitry configured to:
provide a pulse width modulated (PWM) drive signal to at least a portion of the plurality of LEDs, the PWM drive signal having a PWM period and a variable duty cycle wherein varying the duty cycle varies an intensity of light emitted from the plurality of LEDs;
provide the PWM drive signal during a first mode of operation; and
provide a direct current (DC) drive signal to at least the portion of the plurality of LEDs during a second mode of operation.

8. A lighting fixture comprising:
a plurality of LEDs providing a light source for general illumination of an environment, the plurality of LEDs comprising at least one string of LEDs;
fixture control circuitry configured to:
provide a pulse width modulated (PWM) drive signal to at least a portion of the plurality of LEDs, the PWM drive signal having a PWM period and a variable duty cycle wherein varying the duty cycle varies an intensity of light emitted from the plurality of LEDs; and
provide the PWM drive signal to the at least one string of LEDs; and
filter circuitry coupled in parallel with the at least one string of LEDs, the filter circuitry configured to filter the PWM drive signal provided to the at least one string of LEDs into a direct current (DC) drive signal.

9. A lighting fixture comprising:
a plurality of LEDs providing a light source for general illumination of an environment, the plurality of LEDs comprising a plurality of strings of LEDs; and
fixture control circuitry configured to:
provide a pulse width modulated (PWM) drive signal to at least a portion of the plurality of LEDs, the PWM drive signal having a PWM period and a variable duty cycle wherein varying the duty cycle varies an intensity of light emitted from the plurality of LEDs;
provide different PWM drive signals to each one of the plurality of strings of LEDs such that the PWM drive signals for each of the plurality of strings of LEDs are out of phase with one another.

10. A lighting system comprising a plurality of lighting fixtures, each of the plurality of lighting fixtures comprising:
a plurality of LEDs providing a light source for general illumination of an environment; and
fixture control circuitry configured to provide a pulse width modulated (PWM) drive signal to at least a portion of the plurality of LEDs, wherein the PWM drive signal is provided to be out of phase with at least a PWM drive signal of another one of the lighting fixtures in the plurality of lighting fixtures.

* * * * *